United States Patent
Asano et al.

(10) Patent No.: US 7,498,616 B2
(45) Date of Patent: Mar. 3, 2009

(54) COMPOUND SEMICONDUCTOR SWITCH CIRCUIT DEVICE

(75) Inventors: Tetsuro Asano, Gunma (JP); Mikito Sakakibara, Saitama (JP); Yuichi Kusaka, Gunma (JP); Hidetoshi Ishihara, Tokyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 306 days.

(21) Appl. No.: 11/412,113

(22) Filed: Apr. 27, 2006

(65) Prior Publication Data

US 2006/0255403 A1 Nov. 16, 2006

(30) Foreign Application Priority Data

| Apr. 28, 2005 | (JP) | ............... 2005-130763 |
| Nov. 25, 2005 | (JP) | ............... 2005-341016 |
| Nov. 25, 2005 | (JP) | ............... 2005-341017 |
| Mar. 7, 2006 | (JP) | ............... 2006-060588 |

(51) Int. Cl.
*H01L 31/0328* (2006.01)

(52) U.S. Cl. ............... 257/187; 257/189; 257/E29.242; 257/E27.012

(58) Field of Classification Search ............... 257/213, 257/351–360, 471, 472, 476, E29.317, 183, 257/185, 187, 189, 191, 192, 196, 197, 198, 257/E29.188, E29.189, E27.012, E29.296, 257/E29.242

See application file for complete search history.

(56) References Cited

U.S. PATENT DOCUMENTS 5,025,296 A * 6/1991 Fullerton et al. ............ 257/409
5,705,847 A * 1/1998 Kashiwa et al. ............ 257/476
7,339,210 B2 3/2008 Asano et al.
7,358,788 B2 4/2008 Asano et al.
2004/0222469 A1* 11/2004 Asano et al. ................ 257/355
2005/0263822 A1 12/2005 Asano
2005/0277255 A1 12/2005 Asano
2006/0151816 A1 7/2006 Asano et al.
2006/0163659 A1 7/2006 Asano et al.
2006/0164150 A1 7/2006 Asano
2006/0249752 A1 11/2006 Asano
2006/0289963 A1 12/2006 Asano

FOREIGN PATENT DOCUMENTS

| JP | 2001-015528 | 1/2001 |
| JP | 2004-254086 | 9/2004 |

* cited by examiner

*Primary Examiner*—Brook Kebede
(74) *Attorney, Agent, or Firm*—Morrison & Foerster LLP

(57) ABSTRACT

A gate wiring electrode is formed into a ladder-like pattern. Moreover, between source electrodes and drain electrodes in the entire Switch MMIC, the gate wiring electrodes are disposed. Furthermore, at a cross part between the gate wiring electrode and the source electrode or the drain electrode, a nitride film having a large relative dielectric constant and a polyimide or a hollow part having a small relative dielectric constant are disposed. Accordingly, a capacitance at the cross part is reduced. Thus, a second harmonic wave level can be lowered. Moreover, a leak of a high-frequency signal between the drain electrode and the source electrode can be prevented. Thus, a third harmonic level can be lowered. Consequently, distortion characteristics of the Switch MMIC can be significantly improved.

14 Claims, 18 Drawing Sheets

FET1-1

COMPOUND SEMICONDUCTOR SWITCH CIRCUIT DEVICE

BACKGROUND OF THE INVENTION

1. Field of the Invention

The present invention relates to a compound semiconductor switch circuit device, and more particularly relates to a compound semiconductor switch circuit device which suppresses a leak of a high-frequency signal and prevents deterioration of distortion characteristics.

2. Description of the Related Art

In a compound semiconductor switch circuit device for which a high power is required, a switching element having a plurality of FETs (Field Effect Transistor) connected to each other in series is adopted. This technology is described for instance in Japanese Patent Application Publication No. 2004-254086 (see FIG. 4).

FIG. 18 shows a Switch MMIC (Monolithic Microwave Integrated Circuit) including two switching elements having a plurality of FETs connected to each other in series, as an example of a conventional compound semiconductor Switch MMIC chip.

On a compound semiconductor substrate, two FET groups to be first and second switching elements SW1 and SW2 are disposed. In each of the FET groups, three FETs are connected in series. A first control resistor CR1 and a second control resistor CR2 are connected, respectively, to six gate electrodes included in the respective FET groups. Moreover, electrode pads I, O1 and O2, which are connected to a common input terminal IN and output terminals OUT1 and OUT2, respectively, and two electrode pads C1 and C2, which are connected to control terminals Ctl1 and Ctl2, respectively, are provided in a periphery of the substrate.

A wiring formed of a second metal layer indicated by a dotted line is a gate metal layer 220 which forms the gate electrodes of the respective FETs. In addition, a wiring formed of a third metal layer indicated by a solid line is a wiring metal layer 230 which connects the respective elements to each other and forms the pads. Moreover, an ohmic metal layer, which is a first metal layer and comes into ohmic contact with the substrate, forms source and drain electrodes of the respective FETs, and the like. The ohmic metal layer is not shown in FIG. 18 because the ohmic metal layer is overlapped by the wiring metal layer.

In FET1-1 of the first switching element SW1, three comb-shaped wiring metal layers 230 extended downward are source electrodes 215 (or drain electrodes) which are connected to the common input terminal pad I. Below the source electrodes 215, source electrodes (or drain electrodes) are provided, which are formed of the ohmic metal layer. The respective source electrodes 215 are connected to each other by a source wiring 231 formed of the wiring metal layer 230.

Moreover, three comb-tooth-shaped wiring metal layers 230 extended upward are drain electrodes 216 (or source electrodes) of FET1-1. Below the drain electrodes 216, drain electrodes (or source electrodes) are provided, which are formed of the ohmic metal layer. The respective drain electrodes 216 are connected to each other by a drain wiring 232 formed of the wiring metal layer 230.

The source electrodes 215 and the drain electrodes 216 are disposed so as to have a shape formed by engaging comb teeth with each other. Between the source and drain electrodes, five comb-tooth-shaped gate electrodes 217 are disposed, which are formed of the gate metal layer 220. The respective gate electrodes 217 are connected to each other by a gate wiring 221 outside an operation region 300 indicated by a dashed line.

In the Switch MMIC described above, a leak of a high-frequency analog signal (hereinafter referred to as a high-frequency signal) occurs between the source and drain electrodes in a spot where the both electrodes are close to each other. Thus, there is a problem that electrical characteristics are deteriorated by the leak.

To be more specific, in the case where the first switching element SW1 is set to be an on-side switching element, the high-frequency signal is transmitted to the first output terminal pad O1 after passing through a channel region of each FET from the common input terminal pad I as indicated by the arrow.

In the second switching element SW2 to be an off-side switching element, an X region surrounded by a chain double-dashed line is exposed to a high-power high-frequency signal since the region is closest to the common input terminal pad I. However, in the X region, no leak of the high-frequency signal occurs. Moreover, on a signal path between the common input terminal IN and the first output terminal OUT1 on the on side, designed values for linearity characteristics of an output signal can be ensured.

However, it was found out that, in a spot where the source and drain electrodes are adjacent to each other and directly face each other in the high-power switch circuit device constituted by the switching element including the plurality of FETs connected to each other in series, the leak of the high-frequency signal occurs outside the channel region of the FET.

Specifically, in Y regions indicated by solid lines, where the source and drain electrodes are adjacent to each other and directly face each other, the leak of the high-frequency signal occurs between the source and drain electrodes (to be more specific, between the source electrodes 215 and the drain wiring 232 and between the source wiring 231 and the drain electrodes 216). Thus, there is a problem that designed values for a distortion level of the output signal cannot be ensured and a harmonic wave level is too high.

FIG. 19 shows another pattern of the conventional Switch MMIC shown in FIG. 18. In the Switch MMIC shown in FIG. 18, the gate wiring 221 is disposed on the side of the common input terminal pad I with respect to the comb-tooth-shaped gate electrodes 217. Moreover, tips of the comb-tooth-shaped gate electrodes 217 are disposed on the side of the first and second output terminal pads O1 and O2.

Meanwhile, in a Switch MMIC shown in FIG. 19, a gate wiring 221 is disposed on the side of first and second output terminal pads O1 and O2 with respect to comb-tooth-shaped gate electrodes 217. Moreover, tips of the comb-tooth-shaped gate electrodes 217 are disposed on the side of a common input terminal pad I. Since other constituent components are the same as those described above in FIG. 18, description thereof will be omitted.

In the pattern of FIG. 19, when a second switching element SW2 is on an off side, despite the fact that an X' region closest to the common input terminal pad I is exposed to a high-power high-frequency signal, source and drain electrodes are adjacent to each other and directly face each other. Thus, it was found out that a large leak of the high-frequency signal occurs in the X' region. To be more specific, on a signal path between a common input terminal IN and a first output terminal OUT1 on an on side, only Pin0.1 dB, which is lower than the designed value by a few dB, can be secured. Moreover, there is a problem that the leak of the high-frequency signal occurs between the source and drain electrodes also in a Y region and distortion characteristics are also poor.

SUMMARY OF THE INVENTION

The invention provides a field effect transistor that includes a compound semiconductor substrate, a plurality of source electrodes elongated in a first direction, a plurality of drain electrodes elongated in the first direction, the source electrodes and the drain electrodes being positioned alternatively with respect to a second direction, a source wiring electrode formed on the substrate and connecting the source electrodes, a drain wiring electrode formed on the substrate and connecting the drain electrodes; and a gate wiring electrode formed on the substrate and comprising a first gate wiring portion disposed parallel to the second direction and a plurality of second gate wiring portions extending from the first gate wiring portion in the first direction, wherein each of the second gate wiring portions is disposed between a corresponding source electrode and a corresponding drain electrode, and said each of the second gate wiring portions bends in the second direction to cover an end portion of the corresponding source electrode or the corresponding drain electrode.

DESCRIPTION OF THE EMBODIMENTS

With reference to FIGS. 1 to 17, embodiments of the present invention will be described in detail.

Figure 1:
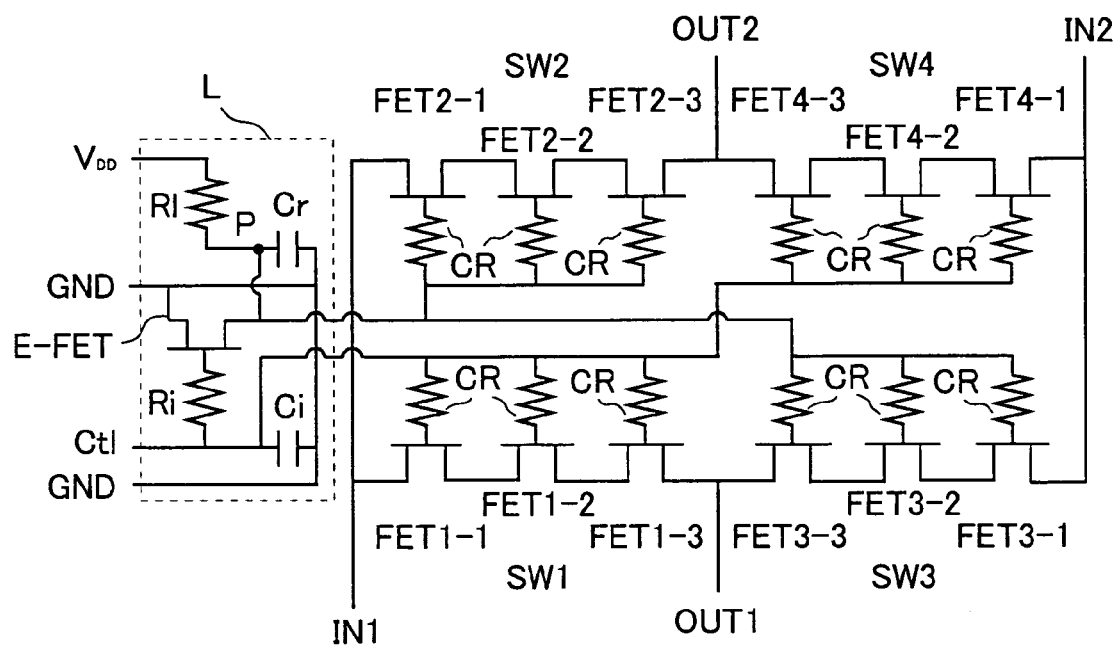
FIG. 1 is a circuit diagram for explaining a first embodiment of the present invention.

First, with reference to FIGS. 1 to 7, a first embodiment will be described. FIG. 1 is a circuit diagram showing an example of a DPDT (double pole double throw) Switch MMIC including four switching elements having a plurality of FETs connected to each other in series.

The DPDT is a Switch MMIC used for a CDMA (Code Division Multiple Access) cellular-phone and the like. The DPDT Switch MMIC has: first to fourth switching elements SW1 to SW4; two first RF ports (a first common input terminal IN1 and a second common input terminal IN2); and two second RF ports (a first common output terminal OUT1 and a second common output terminal OUT2). A SPDT (Single Pole Double Throw) switch including the first and second switching elements SW1 and SW2 and another SPDT switch including the third and fourth switching elements SW3 and SW4 are connected to each other by the second RF ports.

Each of the switching elements SW1 to SW4 is a FET group including three FETs connected in series. Each of the FETs constituting the switching elements is a depletion type FET (D-FET). For example, in the first switching element SW1, FET1-1, FET1-2 and FET1-3 are connected in series. In the second switching element SW2, FET2-1, FET2-2 and FET2-3 are connected in series. In the third switching element SW3, FET3-1, FET3-2 and FET3-3 are connected in series. In the fourth switching element SW4, FET4-1, FET4-2 and FET4-3 are connected in series.

A drain electrode (or a source electrode) of one end (FET1-3) of the first switching element SW1 is connected to a drain electrode (or a source electrode) of one end (FET3-3) of the third switching element SW3. Moreover, a drain electrode (or a source electrode) of one end (FET2-3) of the second switching element SW2 is connected to a drain electrode (or a source electrode) of one end (FET4-3) of the fourth switching element SW4.

Source electrodes (or drain electrodes) of the other ends (FET1-1 and FET2-1) of the first and second switching elements SW1 and SW2 are connected to the first common input terminal IN1. Moreover, source electrodes (or drain electrodes) of the other ends (FET3-1 and FET4-1) of the third and fourth switching elements SW3 and SW4 are connected to the second common input terminal IN2.

Moreover, the Switch MMIC has the first common output terminal OUT1 shared between the first and third switching elements SW1 and SW3 and the second common output terminal OUT2 shared between the second and fourth switching elements SW2 and SW4. Note that, in the Switch MMIC, the source electrodes and the drain electrodes are equivalent to each other. Therefore, hereinafter, the same goes for the case where the source electrodes and the drain electrodes are replaced with each other.

Moreover, control resistors CRs are connected to gate electrodes of the FETs of the first and fourth switching elements SW1 and SW4, respectively, and the gate electrodes are connected to a control terminal Ctl through a logic circuit L indicated by a broken line. Furthermore, gate electrodes of the second and third switching elements SW2 and SW3 are also connected to a point P in the logic circuit L through control resistors CRs, respectively.

The control resistors CRs are disposed for the purpose of preventing leaks of high-frequency signals through the gate electrodes with respect to a direct current potential of the control terminal Ctl to be an AC ground and a direct current potential of the point P in the logic circuit L. A resistance value of each of the control resistors CRs is about 5KΩ to 10KΩ.

The Switch MMIC of the first embodiment includes the logic circuit L. The logic circuit L is an inverter circuit, which has the following configuration.

A drain electrode of an enhancement type FET (E-FET) having a source electrode connected to a GND terminal is connected to the point P. Moreover, one end of a load resistor R1 is connected to the point P, and the other end of the load resistor R1 is connected to a power supply terminal $V_{DD}$. A gate electrode of the E-FET is connected to the control terminal Ctl through an input resistor Ri.

Between the control terminal Ctl and the GND terminal and between the point P and the GND terminal, a capacitance Ci and a capacitance Cr are connected, respectively, for absorbing noise and preventing oscillation. Moreover, the input resistor Ri is disposed for preventing electrostatic breakdown, absorbing noise and preventing oscillation.

The logic circuit L (the inverter circuit) is operated as described below. A logic signal applied to the control terminal Ctl is inverted by the inverter, and an inverted signal of a control signal is generated at the point P. Specifically, when 3V is set at the control terminal Ctl, 0V is set at the point P, and, when 0V is set at the control terminal Ctl, 3V is set at the point P.

Circuit operations of the DPDT Switch MMIC shown in FIG. 1 are as follows. When 3V is applied to the control terminal Ctl, the first and fourth switching elements SW1 and SW4 are turned on, in each of which a signal of the control terminal Ctl is directly inputted to the gate electrodes. Thus, a conduction state is set between the first common input terminal IN1 and the first common output terminal OUT1 and between the second common input terminal IN2 and the second common output terminal OUT2, and signal paths are formed, respectively.

Meanwhile, the second and third switching elements SW2 and SW3 are turned off, in each of which a signal of the point P, that is, an inverted signal 0V is inputted to the gate electrodes. Therefore, paths between the first common input terminal IN1 and the second common output terminal OUT2 and between the second common input terminal IN2 and the first common output terminal OUT1 are cut off. When 0V is applied to the control terminal Ctl, an operation opposite to the above is performed.

In the DPDT Switch MMIC as described above, it is possible to use the first and second RF ports by interchanging both. In such a case, paths of high-frequency signals from the common input terminals to the common output terminals are reversed.

Figure 2:
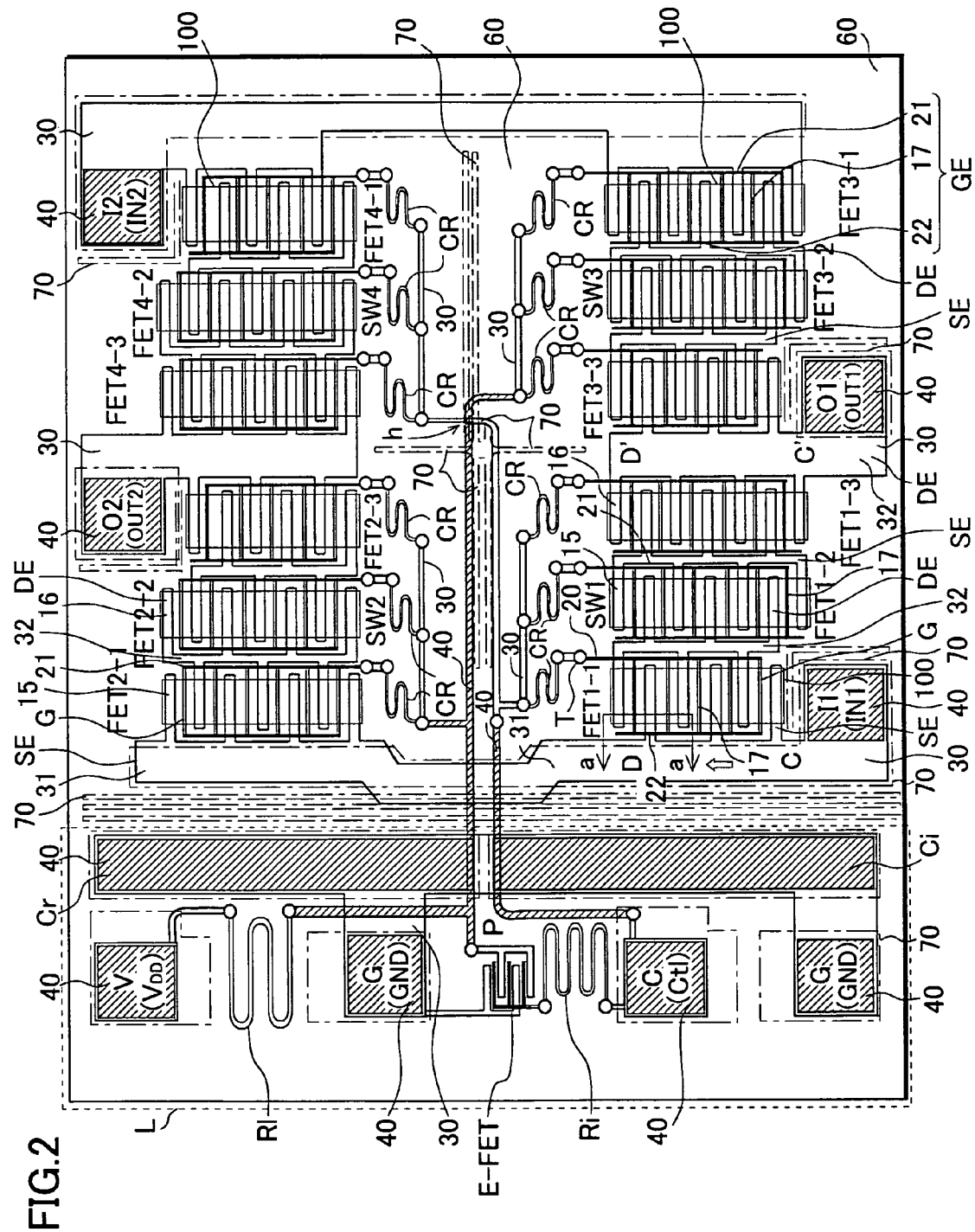
FIG. 2 is a plan view showing the first embodiment of the present invention.

FIG. 2 is a plan view showing integration of the DPDT Switch MMIC described above on one chip of a compound semiconductor substrate. Pattern arrangement of respective elements included in a circuit is approximately the same as that of the circuit diagram of FIG. 1. A FET may be any of a MESFET (Metal Semiconductor Field Effect Transistor), a GaAs JFET (Junction FET) and a HEMT (High Electron Mobility Transistor). Here, description will be given by mainly using the HEMT.

In a substrate structure of the HEMT, for example, a buffer layers, electron supply layers, a channel (electron transit) layer, a cap layer and the like are grown on a semi-insulating GaAs substrate. Moreover, in the HEMT, conduction regions such as operation regions 100, control resistors CRs, a load resistor R1 and an input resistor Ri are formed by isolation using an insulating region 60 that reaches the buffer layers. Here, the conduction regions are, for example, n type impurity regions.

Each of the first to fourth switching elements SW1 to SW4 is a FET group including three FETs connected in series. Gate electrodes of the respective switching elements SW1 to SW4 are connected to the control resistors CRs through gate takeout parts T, respectively. Moreover, on a periphery of the substrate, provided are a first common input terminal pad I1, a second common input terminal pad I2, a first common output terminal pad O1 and a second common output terminal pad O2 which are connected to the first common input terminal IN1, the second common input terminal IN2, the first common output terminal OUT1 and the second common output terminal OUT2, respectively. In the logic circuit L surrounded by a broken line, as shown in FIG. 2, an E-FET, pads V, G and C corresponding to the respective terminals, the load resistor R1, the input resistor Ri, the capacitances Cr and Ci, and the like are disposed. The configuration and operations of the logic circuit L are as described above, and detailed description thereof will be omitted here.

Moreover, since the respective switching elements have the same configuration, the first switching element SW1 will be described below.

In each of FET1-1, FET1-2 and FET1-3, first source electrodes 13 and first drain electrodes 14 are formed of an ohmic metal layer (AuGe/Ni/Au) which is a first metal layer and comes into ohmic contact with the substrate. Note that the ohmic metal layer is not shown in FIG. 2 because the ohmic metal layer is overlapped by a first wiring metal layer 30.

A second metal layer is a gate metal layer (for example, Pt/Mo) 20, which forms a gate wiring electrode GE. The gate wiring electrode GE has a ladder-like pattern. Specifically, the gate wiring electrode GE is formed of a plurality of strip-shaped gate electrodes 17 equally spaced, a gate wiring 21 and a connection part 22. The ladder-like pattern is formed by connecting one ends of the gate electrodes 17 adjacent to each other with the connection part 22 and connecting the other ends thereof by the gate wiring 21.

A third metal layer is the first wiring metal layer (Ti/Pt/Au) 30, which overlaps the ohmic metal layer and forms a source wiring electrode SE and a drain wiring electrode DE. Moreover, the first wiring metal layer 30 forms lower electrodes of the capacitances Ci and Cr, lower electrodes of the pads, and wirings.

A fourth metal layer is a second wiring metal layer (Ti/Pt/Au) 40, which forms, as indicated by hatching, the respective electrode pads (V, G, C, I1, I2, O1 and O2), upper electrodes of the capacitances Ci and Cr, and wirings. The source wiring electrode SE has a comb shape and is formed in the following manner. Specifically, respective comb teeth (hereinafter referred to as second source electrodes 15) of the source wiring electrode SE, which overlap the first source electrodes 13, are connected by a source wiring 31. The source wiring 31 is also formed of the first wiring metal layer 30, in other words, the second source electrodes 15 and the source wiring 31 continuously form the source wiring electrode SE.

The drain wiring electrode DE has a comb shape and is formed in the following manner. Specifically, respective comb teeth (hereinafter referred to as second drain electrodes 16) of the drain wiring electrode DE, which overlap the first drain electrodes 14, are connected by a drain wiring 32. The drain wiring 32 is also formed of the first wiring metal layer 30, in other words, the second drain electrodes 16 and the drain wiring 32 continuously form the drain wiring electrode DE. The first wiring metal layer 30 also forms the lower electrodes of the respective pads.

Specifically, the source wiring electrode SE and the drain wiring electrode DE are formed of only the first wiring metal layer 30. Meanwhile, the respective pads are formed by laminating the first and second wiring metal layers 30 and 40.

Moreover, the first and second wiring metal layers 30 and 40 form wirings having a desired pattern for connecting the first to fourth switching elements SW1 to SW4 with the logic circuit L. The wirings have a region where the first and second wiring metal layers 30 and 40 are patterned individually, and a region where the both metal layers intersect with each other with an insulating film interposed therebetween.

In the operation region 100, three of the first wiring metal layers 30 extended from the left side in FET1-1 are the second source electrodes 15 connected to the first common input terminal pad I1. Below the second source electrodes 15, the first source electrodes 13 formed of the ohmic metal layer are disposed. Moreover, three of the first wiring metal layers 30 extended from the right side are the second drain electrodes 16 of FET1-1. Below the second drain electrodes 16, the first drain electrodes 14 are disposed. The both electrodes are disposed so as to have a shape formed by engaging comb teeth with each other. Between the source and drain electrodes, the five gate electrodes 17 are disposed In FET1-2, three of the second drain electrodes 16 extended from the left side are connected to the second drain electrodes 16 in FET1-1. Here, since the second drain electrodes of FET1-2 are merely passing points of high-frequency signals and, generally, are not required to be drawn out to the outside, no pads are provided. Moreover, four of the second source electrodes 15 extended from the right side are connected to the second source electrodes 15 in FET1-3. Similarly, since the second source electrodes described above are also merely passing points of high-frequency signals and, generally, are not required to be drawn out to the outside, no pads are provided. Below the both electrodes described above, the ohmic metal layer is disposed. The both electrodes are disposed so as to have a shape formed by engaging comb teeth with each other. Between the both electrodes, the six comb-shaped gate electrodes 17 are disposed.

Compared with a switching element including only one FET, a switching element like this including a plurality of FETs connected in series can be cut off against a larger voltage amplitude when the switching element is OFF. Thus, the Switch MMIC constituted by the switching element including the plurality of FETs becomes a high-power Switch MMIC. In this event, generally, the source electrodes or the drain electrodes of the FETs, which become connection parts when the FETs are connected in series, are not required to be drawn out to the outside. Thus, it is not required to provide pads.

In FET1-3, three of the first wiring metal layers 30 extended from the left side are the second source electrodes 15. Below the second source electrodes 15, the first source electrodes 13 are disposed. Moreover, four of the comb-shaped first wiring metal layers 30 extended from the right side are the second drain electrodes 16 connected to the first common output terminal pad O1. Below the second drain electrodes 16, the first drain electrodes 14 are disposed. The both electrodes are disposed so as to have a shape formed by engaging comb teeth with each other. Between the both electrodes, six gate electrodes 17 are disposed The plurality of gate electrodes 17 in each of FET1-1, FET1-2 and FET1-3 have one ends bundled by the connection part 22. Moreover, the other ends of the gate electrodes 17 are bundled by the gate wiring 21 and connected to the gate take-out part T. The gate take-out part T is connected to the control terminal pad C through the control resistor CR. As described above, in this embodiment, the gate take-out part T is an extension of the gate wiring 21. However, the gate take-out part T is not an extension of the connection part 22.

The control resistor CR is formed of the conduction region (an impurity region) which is isolated by the insulating region 60 as described above. In this embodiment, the control resistor CR is formed of a high resistance element. The high resistance element is obtained by removing the cap layer in the HEMT structure and setting only semiconductor layers having a high sheet resistance value in lower layers than the cap layer to be a resistor layer. It is required to set the control resistor CR to have a high resistance value, in order to prevent a leak of a high-frequency signal. By using the high resistance element to form the control resistor CR, the resistance value can be increased within a short distance. Meanwhile, in order to obtain accurate values, the load resistor R1 and the input resistor Ri are formed of the conduction regions without removing the cap layer in the HEMT structure.

Moreover, around the respective pads I1, I2, O1 and O2, peripheral conduction regions 70 are disposed as indicated by dashed lines for preventing the leak of the high-frequency signal and improving isolation. Furthermore, similarly, the peripheral conduction regions 70 are formed also between the respective pads and the respective FETs, between the respective pads and the source (drain) wiring electrodes, and between the resistors. The peripheral conduction regions 70 are, for example, high-concentration n type impurity regions including the cap layer.

Furthermore, between the first and second switching elements SW1 and SW2 and the logic circuit L, the peripheral conduction region 70 is also disposed for improving the isolation. The peripheral conduction regions 70 described above are also isolated by the insulating region 60. The peripheral conduction regions 70 are either connected to the adjacent pads or the metal layers such as the source (drain) wiring electrodes in a state where a direct current flows between them (hereinafter referred to as "DC-connected") or have a floating potential.

Figure 3A:
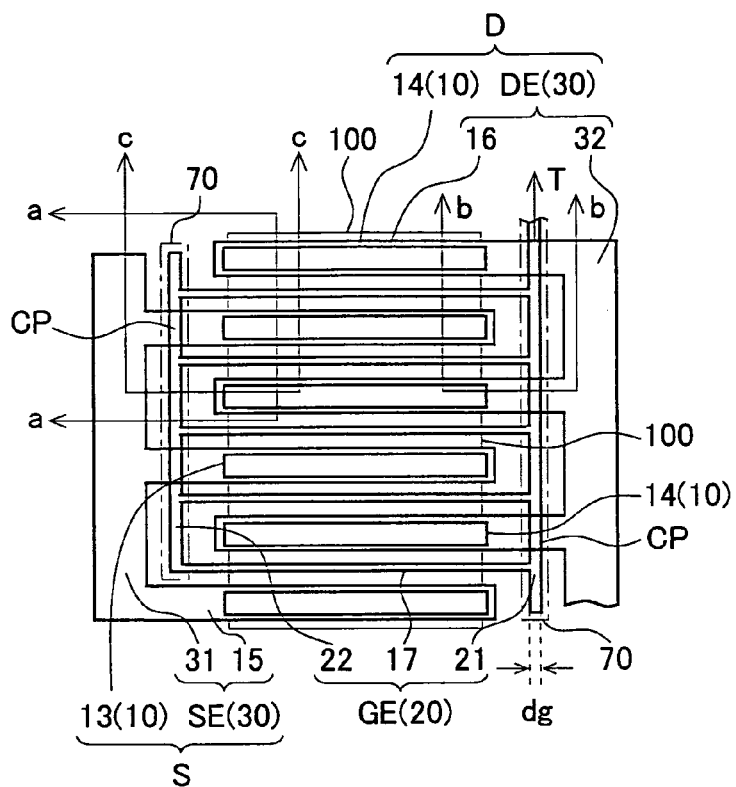
FIG. 3A is a plan view and FIG. 3B is a cross-sectional view showing the first embodiment of the present invention.
Figure 3B:
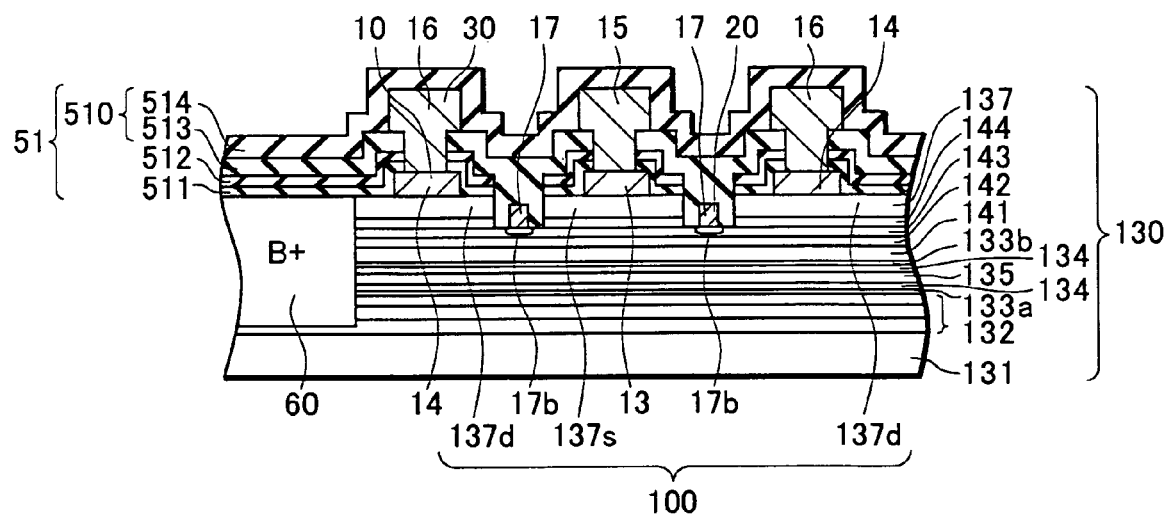

FIGS. 3A and 3B are enlarged views of the operation region 100 of FET1-1, for example, shown in FIG. 2. FIG. 3A is a plan view and FIG. 3B is a cross-sectional view along the line a-a in FIG. 3A.

As shown in FIG. 3A, the strip-shaped first source and drain electrodes 13 and 14 are disposed on the operation region 100, and come into contact with source and drain regions (not shown here), respectively. Moreover, the strip-shaped second source and drain electrodes 15 and 16 are disposed while overlapping the first source and drain electrodes 13 and 14. The second source electrodes 15 adjacent to each other are connected by the source wiring 31 to form the comb-shaped source wiring electrode SE. Similarly, the second drain electrodes 16 adjacent to each other are connected by the drain wiring 32 to form the comb-shaped drain wiring electrode DE.

Each of the gate electrodes 17 is formed to have a strip shape having a predetermined gate length, and is disposed between the second source electrode 15 and the second drain electrode 16. Moreover, one ends (tips) of the adjacent gate electrodes 17 are connected to each other by the connection part 22, and the other ends thereof are connected to the gate wiring 21.

Specifically, the gate wiring electrode GE forms the ladder-like pattern by use of the gate electrodes 17, the gate wiring 21 and the connection part 22. In FET1-1, the connection part 22 is disposed near the one ends of the second drain electrodes 16, and the other ends of the second drain electrodes 16 are connected to the drain wiring 32. Meanwhile, the gate wiring 21 is disposed near one ends of the second source electrodes 15 and the other ends of the second source electrodes 15 are connected to the source wiring 31. Specifically, the connection part 22 is disposed between the source wiring 31 and the second drain electrodes 16, both of which are close and adjacent to each other. Moreover, the gate wiring 21 is disposed between the drain wiring 32 and the second source electrodes 15, both of which are close and adjacent to each other. Both of the gate wiring 21 and the connection part 22 have a width of 3 μm to 5 μm.

The second source electrode 15 intersects with the connection part 22 with an insulating film (not shown) interposed therebetween at a cross part CP. Moreover, the second drain electrode 16 intersects with the gate wiring 21 with an insulating film (not shown) interposed therebetween at a cross part CP.

Although not shown in the drawings here, arrangement of the drain wiring electrode DE and the source wiring electrode SE in FET1-2 is opposite to that in FET1-1. Specifically, in FET1-2, the connection part 22 of the gate electrodes 17 is disposed near the one ends of the second source electrodes 15, and the gate wiring 21 is disposed near the one ends of the second drain electrodes 16. To be more specific, the connection part 22 is disposed between the drain wiring 32 and the second source electrodes 15, both of which are close and adjacent to each other. Moreover, the gate wiring 21 is disposed between the source wiring 31 and the second drain electrodes 16, both of which are close and adjacent to each other.

At a cross part CP, the second source electrode 15 intersects with the gate wiring 21 with an insulating film interposed therebetween. Moreover, at a cross part CP, the second drain electrode 16 intersects with the connection part 22 with an insulating film interposed therebetween. FET1-3 is the same as FET1-1 (see FIG. 2).

FIG. 3B is a cross-sectional view along the line a-a in FIG. 3A. A substrate 130 is obtained by growing undoped buffer layers 132 on a semi-insulating GaAs substrate 131 and growing, on the buffer layers 132, a first electron supply layer 133a that is an n+ type AlGaAs layer, a spacer layer 134, a channel (electron transit) layer 135 that is an undoped InGaAs layer, a spacer layer 134, a second electron supply layer (n+ type AlGaAs layer) 133b, a first undoped layer 141, a second undoped layer 142, a third undoped layer 143, a stable layer 144, and a cap layer 137.

The buffer layers 132 is a high resistance layer having no impurities added therein, and a thickness thereof is about several thousands Å.

There are two electron supply layers 133, including the first electron supply layer 133a and the second electron supply layer 133b. The electron supply layers 133a and 133b are disposed below and above the channel layer 135, respectively. Moreover, between the channel layer 135 and the respective electron supply layers 133, the spacer layers 134 are disposed, respectively.

The electron supply layers 133 are the n+ type AlGaAs layers and are formed by use of a material having a band gap larger than that of the channel layer 135. Moreover, an impurity concentration of n type impurities (for example, Si) in the n+ type AlGaAs layers of the electron supply layers 133 is related to an on resistance Ron of the HEMT and a pinch-off voltage and is set to $3.3 \times 10^{18}$ cm$^{-3}$ in this embodiment.

By adopting the structure as described above, electrons generated from donor impurities of the electron supply layers 133 move toward the channel layer 135 to form a channel to be a current path. As a result, the electrons and donor ions are spatially separated from each other on a heterojunction interface. Although the electrons travel through the channel layer 135, there is a very small influence of Coulomb scattering since no donor ions exist in the channel layer 135. Thus, high electron mobility can be achieved.

Moreover, the first and second electron supply layers 133a and 133b are disposed below and above the channel layer 135. By adopting such a double heterojunction structure, a carrier density is increased. Thus, the on resistance Ron can be significantly reduced.

The first undoped layer 141 is provided on the second electron supply layer 133b while coming into contact therewith. The both layers are lattice-matched to each other. The first undoped layer 141 is an undoped AlGaAs layer and has a thickness of 85 Å. In the case where even small crystal distortion occurs in a portion close to the channel layer 135, good HEMT characteristics cannot be obtained with good reproducibility. However, since the first undoped layer 141 is formed of the same AlGaAs layer as that of the second electron supply layer 133b close to the channel layer 135, a factor that causes the crystal distortion to occur in the portion close to the channel layer 135 can be completely eliminated.

The second undoped layer 142 is provided on the first undoped layer 141 while coming into contact therewith, and is lattice-matched to the first undoped layer 141. The second undoped layer 142 is an undoped InGaP layer and has a thickness of 20 Å. Moreover, the second undoped layer 142 functions as an etching stop layer for the third undoped layer 143 provided thereon.

The third undoped layer 143 is provided on the second undoped layer 142 while coming into contact therewith, and is lattice-matched to the second undoped layer 142. The third undoped layer 143 is an undoped AlGaAs layer and has a thickness of 145 Å. On a surface of the third undoped layer 143, the gate electrodes 17 are provided. In the AlGaAs layer, crystal growth is stable, compared with the InGaP layer. Therefore, there is also an effect of obtaining stable HEMT characteristics by forming the gate electrodes 17 on the surface of the AlGaAs layer.

A total thickness of the first to third undoped layers 141 to 143 is designed so as to obtain predetermined breakdown voltage and on resistance of the HEMT (D-FET) included in the switching element.

The stable layer 144 is provided on the third undoped layer 143 while coming into contact therewith, and is lattice-matched to the third undoped layer 143. Moreover, the stable layer 144 is also lattice-matched to the cap layer 137 provided thereon. The stable layer 144 is an undoped InGaP layer or a doped InGaP layer, which is resistant to chemical stress from the outside since the layer is hardly oxidized, and is stable in terms of reliability. Moreover, the stable layer 144 has a thickness of 100 Å.

As to the switch circuit device of this embodiment, in manufacturing steps before formation of the gate electrodes 17, there is a step of removing, by plasma etching, a part of a nitride film 51 used as an etching mask for the cap layer 137. Thus, the chemically stable InGaP layer (the stable layer 144) is disposed below the cap layer 137. In the plasma etching, the stable layer 144 is exposed to a surface of the operation region 100. Accordingly, the operation region 100 can be protected from plasma damage by the stable layer 144. Because the stable layer 144 has the thickness of 100 Å, the operation region 100 can be sufficiently protected from the plasma damage. Although the stable layer 144 suffers from the plasma damage, the gate electrodes 17 can be formed on the clean third undoped layer 143 since the stable layer 144 is removed when the gate electrodes 17 are formed. Moreover, the stable layer 144 also functions as an etching stop layer for the cap layer 137 provided thereon, and is etched to have the same pattern as that of the cap layer 137.

As described above, by adopting the structure in which the InGaP layers and the AlGaAs layers to be the etching stop layers, respectively, are repeatedly grown on each other, the predetermined breakdown voltage can be easily realized with good reproducibility.

Moreover, by lattice-matching the InGaP layers to the GaAs layer and the undoped AlGaAs layer, the crystal distortion is avoided and a crystal defect such as a slit can be prevented.

Moreover, by lattice-matching the stable layer (InGaP layer) 144 to the GaAs layer and the undoped AlGaAs layer, the crystal distortion is avoided and the crystal defect such as the slit can be prevented.

The n+ type GaAs layer 137 to be the cap layer is grown on the top. A thickness of the cap layer 137 is 600 Å or more, and an impurity concentration thereof is $2 \times 10^{18}$ cm$^{-3}$ or more. It is preferable that the thickness thereof is about 1000 Å and the impurity concentration thereof is $3 \times 10^{18}$ cm$^{-3}$ or more.

The operation region 100 of the HEMT is isolated from the other regions, as indicated by the thin line in FIG. 3A, by the insulating region 60 that reaches the buffer layers 132. Here, an epitaxial structure of the HEMT includes the cap layer 137. Since the impurity concentration of the cap layer 137 is as high as about 1 to $5 \times 10^{18}$ cm$^{-3}$, the region where the cap layer 137 is disposed can functionally be a high-concentration impurity region.

The operation region 100 of the HEMT will be hereinafter referred to as a region which is isolated by the insulating region 60 and in which the first and second source electrodes 13 and 15, the first and second drain electrodes 14 and 16 and the gate electrodes 17 of the HEMT are disposed. Specifically, a total region including all semiconductor layers which form the HEMT, such as the electron supply layers 133, the channel (electron transit) layer 135, the spacer layers 134, the first to third undoped layers 141 to 143, the stable layer 144 and the cap layer 137, is set to be the operation region 100.

The insulating region 60 is a region which is not completely electrically insulated but is insulated by providing carrier traps in epitaxial layers (the semiconductor layers) by ion-implanting impurities (boron, hydrogen or oxygen). Specifically, although impurities exist as the epitaxial layers also in the insulating region 60, the impurities are inactivated by implantation of the impurities (boron, hydrogen or oxygen) for insulation. And resistivity of the insulating region 60 is equal to or more than $1 \times 10^7$ Ω·cm and equal to or less than $1 \times 10^9$ Ω·cm. On the other hand the resistivity of insulator like glass, ceramics or gum is more than $1 \times 10^{10}$ Ω·cm. Namely the insulating region 60 is clearly distinguished from insulator like glass, ceramics or gum at resistivity value too. Actually the insulating region 60 is "semiconductor", and insulator like glass, ceramics or gum is not "semiconductor". That is, the semiconductor and insulator are substantially different.

In the operation region 100, as shown in FIG. 3B, a source region 137s and a drain region 137d are provided by partially removing the cap layer 137 to which the high-concentration impurities are added. In the source and drain regions 137s and 137d, the first source and drain electrodes 13 and 14 are connected, which are formed of the ohmic metal layer 10. The first source and drain electrodes 13 and 14 and the cap layer 137 therearound are covered with the nitride film 51 (first to fourth nitride films 511 to 514). The first source and drain electrodes 13 and 14 come into contact with the second source and drain electrodes 15 and 16, which are provided thereon and formed of a first wiring metal layer 30, through contact holes provided in the nitride film 51.

Moreover, the cap layer 137 in the operation region 100 is partially removed by etching to expose the third undoped layer 143, for example, in accordance with the predetermined breakdown voltage and the on resistance. Thus, the gate electrodes 17 are formed. The gate electrodes 17 and the third undoped layer 143 exposed therearound are covered with the third and fourth nitride films 513 and 514. The fourth nitride film 514 is an interlayer insulating film between the first wiring metal layer 30 and the second wiring metal layer 40 (not shown).

In each of the gate electrodes 17, a part of lowermost metal (Pt) of the gate metal layer 20 (for example, Pt/Mo) is buried in the surface of the operation region 100 by heat process. The buried Pt (this region will be hereinafter referred to as a buried part 17b) is also a part of the gate electrode 17 and functions as the gate electrode 17. A bottom of the buried part 17b is positioned in the third undoped layer 143. Specifically, the gate electrode 17 including the buried part 17b forms a Schottky junction with the third undoped layer 143.

As described above, in this embodiment, a buried electrode structure is adopted, in which a part of Pt is buried in the surface of the operation region 100. Accordingly, the bottom of the buried part 17b can have curved ends.

As described above, in the step of forming the gate electrodes 17, the stable layer 144 before deposition of the gate metal layer 20 suffers from the plasma damage. If the gate electrode 17 is formed on the stable layer 144 and the buried part 17b is formed in the state described above, it takes time to perform the heat process for burying. Moreover, since the stable layer 144 is the InGaP layer, if the buried part 17b is formed in the InGap layer, the buried part 17b does not have a continuous curve having a predetermined curvature radius. Therefore, in this embodiment, the stable layer 144 is removed and the gate metal layer 20 is evaporated on the clean surface of the third undoped layer 143. Thus, burying is finished by brief heat process. Moreover, a shape of an end of the buried part 17b, that is, an end of the Schottky junction is set to have the continuous curve having the predetermined curvature radius. Therefore, when a reverse bias is applied to the gate electrode 17, electric field strength is dispersed. Specifically, by relaxing electric field concentration, maximum electric field strength is reduced. Thus, a large breakdown voltage can be obtained.

Moreover, the buried part 17b is positioned in the third undoped layer 143. However, even if the bottom of the buried part 17b is positioned in any of the first to third undoped layers 141 to 143, no layer having impurities added therein exists between the gate electrode 17 and the electron supply layer 133 (the second electron supply layer 133b). In other words, the case described above is equivalent to the case where the gate electrode 17 is provided in the first undoped layer 141 which is substantially continuous with the electron supply layer 133.

As described above, in the double heterojunction structure, the gate electrode 17 is provided in the undoped layer continuous with the electron supply layer 133. Thus, the impurity concentration of the electron supply layer can be increased to $3.3 \times 10^{18}$ cm$^{-3}$. Specifically, in the HEMT, a very low on resistance can be realized while securing a predetermined breakdown voltage. Thus, the on resistance Ron=1.3 Ω/mm is realized at a gate voltage Vg=0V, as an on resistance for a gate width of 1 mm, while securing a breakdown voltage of 19V at Vp=−0.8 V. This value of the on resistance is very low for the switch HEMT.

The first and third undoped layers 141 and 143 are the AlGaAs layers, and the second undoped layer 142 and the stable layer 144 are the InGaP layers. The InGaP layer and the AlGaAs layer have a high etching selection ratio each other. Thus, a desired layer can be easily exposed by wet etching.

Specifically, the second undoped layer 142 becomes an etching stop layer when the first undoped layer 141 is exposed. Moreover, the third undoped layer 143 is provided for forming the gate electrode 17 on the clean undoped layer by removing the stable layer 144 suffering from the plasma damage by selective etching.

The gate wiring 21 and the connection part 22 are also formed by evaporation of the gate metal layer 20, as in the case of the gate electrode 17.

Figure 4A:
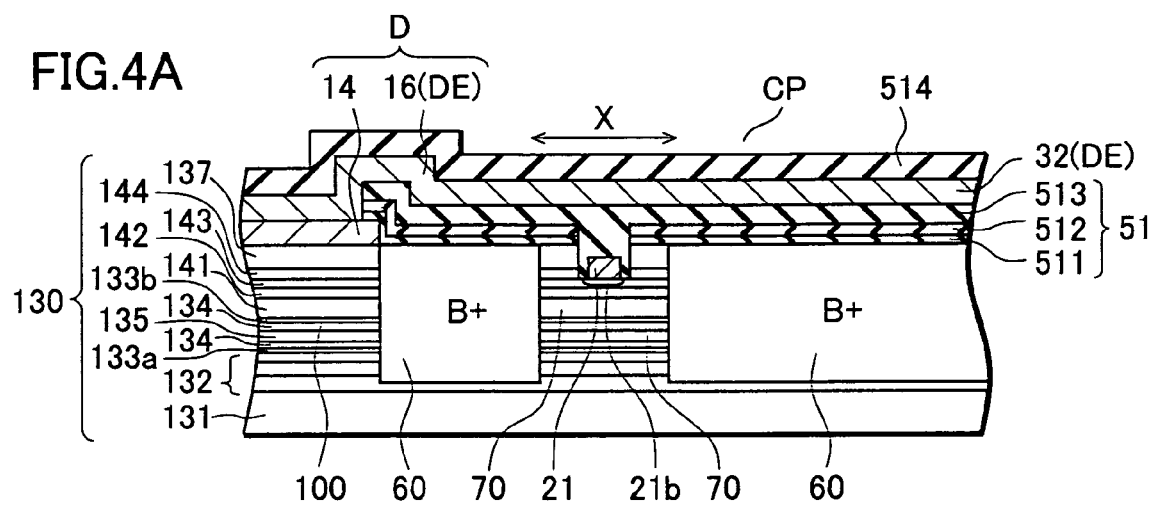
FIGS. 4A and 4B are cross-sectional views showing the first embodiment of the present invention.
Figure 4B:
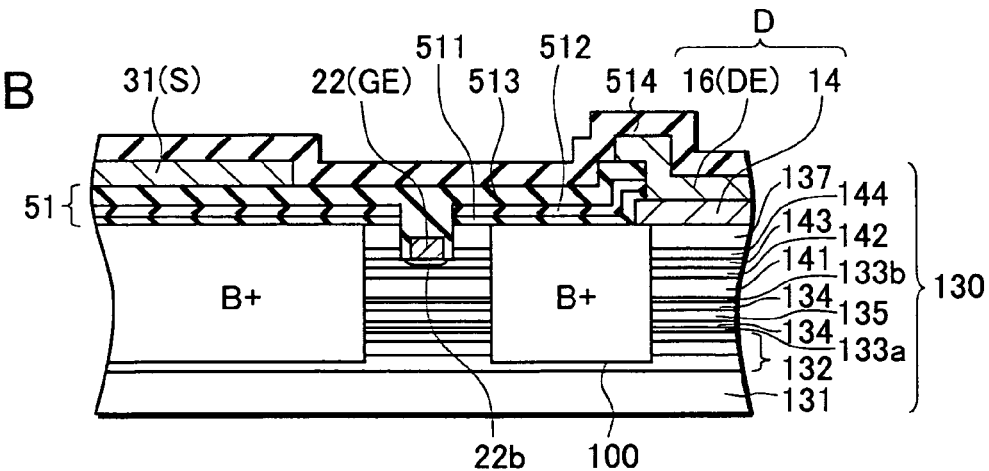

FIGS. 4A and 4B are cross-sectional views around the gate wiring 21 and the connection part 22. FIG. 4A is a cross-sectional view along the line b-b in FIG. 3A, and FIG. 4B is a cross-sectional view along the line c-c in FIG. 3A.

As shown in FIG. 4A and FIG. 3A, the gate wiring 21 and the drain wiring electrode DE (specifically, the second drain electrode 16) intersect with each other with the nitride film 51 (the third nitride film 513) interposed therebetween at the cross part CP. The second drain electrode 16 overlaps the first drain electrode 14 on the operation region 100.

The gate wiring 21 and the second drain electrode 16 are extended in directions perpendicular to each other. The gate wiring 21 is provided on the third undoped layer 143 exposed by etching the cap layer 137 and the stable layer 144, as in the case of the gate electrode 17. Moreover, a part of the gate wiring 21 is buried in the third undoped layer 143.

The gate wiring 21 is isolated from the operation region 100 by the insulating region 60 that reaches the buffer layers 132 so as to dispose a conduction region (a high-concentration impurity region) as indicated by the dashed line in FIG. 3A, in other words, the substrate 130 including the cap layer 137 therearound. The gate wiring 21 and the conduction region (hereinafter referred to as the peripheral conduction region 70) therearound are connected to each other in a state where a direct current flows (hereinafter referred to as "DC-connected"). Thus, isolation of the gate wiring 21 is improved.

Here, the gate electrode 17 and the gate wiring 21 (and also the connection part 22) of the HEMT are evaporated on the third undoped layer 143. A brief description will be given below. Specifically, after a photolithography step of exposing formation regions of the gate electrode 17 and the gate wiring 21, the nitride film used as a mask is plasma-etched and the cap layer 137 is side-etched by about 0.3 μm. Thereafter, the nitride film above the side-etched portion is plasma-etched, the stable layer 144 damaged by plasma is removed, and the gate metal layer 20 is evaporated on the third undoped layer 143. Thus, the gate electrode 17 and the gate wiring 21 are formed.

Specifically, immediately below the gate wiring 21, the first to third undoped layers 141 to 143 are disposed. Moreover, the peripheral conduction region 70, to which the gate wiring 21 is DC-connected, is the substrate 130 including the cap layer 137 disposed around the gate wiring 21. In other words, although the gate wiring 21 is not directly fixed to the peripheral conduction region 70, the gate wiring can be said to be sufficiently DC-connected thereto within a distance as short as about 0.3 μm.

Note that, in the Switch MMIC, the resistors are also formed of the conduction region (impurity region). Moreover, in order to improve the isolation, the peripheral conduction regions (impurity regions) 70 are also formed around the respective pads (see FIG. 2). As shown in FIGS. 3A and 3B, the patterns described above are isolated from each other by the insulating region 60.

Moreover, although not shown in the drawings, a cross section of a cross part CP between the connection part 22 and the source wiring electrode SE (the second source electrode 15) has the same configuration as that of the cross part CP between the gate wiring 21 and the drain wiring electrode DE in FIG. 4A.

As shown in FIGS. 4B and 3A, in this embodiment, between the drain wiring electrode DE and the source wiring electrode SE, which are close and adjacent to each other, the gate wiring electrode GE is disposed. To be more specific, the connection part 22 is disposed between one ends of the first and second drain electrodes 14 and 16 and the source wiring 31 adjacent thereto. The first drain electrode 14 of the first metal layer and the drain wiring electrode DE (the second drain electrode 16 and the drain wiring 32) of the second metal layer will be hereinafter collectively referred to as a drain electrode D. Similarly, the first source electrode 13 of the first metal layer and the source wiring electrode SE (the second source electrode 15 and the source wiring 31) of the second metal layer will be collectively referred to as a source electrode S.

A high-frequency signal is transmitted to the drain electrode D and the source wiring 31 (the source electrode S). Thus, there is a problem that the high-frequency signal leaks in a spot where the drain electrode D and the source wiring 31 are close to each other. However, in this embodiment, the connection part 22 of the gate electrode 17, which is disposed between the drain electrode D and the source wiring 31, can prevent the high-frequency signal from leaking between the drain electrode D and the source wiring 31 (the source electrode S). Thus, a third harmonic wave level can be reduced.

Furthermore, the gate wiring 21 (gate wiring electrode GE) is disposed between one end of the source electrode S and the drain wiring 32 (the drain electrode D) which are close to each other (see FIG. 3A), although its cross sectional view is not provided here since it is the same configuration as the one shown in FIG. 4B. Leaks of a high-frequency signal between the source electrode S and the drain wiring 32 (the drain electrode D) can be prevented. Thus, a third harmonic wave level can be reduced.

With reference to FIGS. 3A and 3B again, description will be given. The respective gate electrodes 17 are formed at equal intervals and have one ends (tips) extended to the outside of the operation region 100 and connected to the connection part 22. Accordingly, a plurality of the gate electrodes 17 are bundled. Moreover, the other ends of the gate electrodes 17 are connected to the gate wiring 21, and the plurality of the gate electrodes 17 are bundled.

As described above, the one ends of the second source electrodes 15, the second drain electrodes 16 and the gate electrodes 17 are ends thereof not connected by the source wiring 31, the drain wiring 32 and the gate wiring 21, respectively. Moreover, the same goes for the first source and drain electrodes 13 and 14 which are overlapped by the second source and drain electrodes 15 and 16, respectively.

Specifically, the one ends of the second source electrodes 15 which overlap the first source electrodes 13 are disposed outside of the operation region 100. Moreover, the one ends of the second drain electrodes 16 which overlap the first drain electrodes 14 are also disposed outside of the operation region 100. Furthermore, the other ends of the second source electrodes 15 and the other ends of the second drain electrodes 16 are also disposed outside of the operation region 100.

The other ends of the second source electrodes 15 are connected to other ends of the other second source electrodes 15 by the source wiring 31. The other ends of the second drain electrodes 16 are connected to other ends of the other second drain electrodes 16 by the drain wiring 32. The one ends of the first and second source electrodes 13 and 15 are close to the drain wiring 32, and the one ends of the first and second drain electrodes 14 and 16 are close to the source wiring 31.

In FET1-1, for example, in FIG. 3A, the connection part 22 is disposed between one end of the drain electrode D and the source electrode S (the source wiring 31) which faces the drain electrode D. Similarly, the gate wiring 21 is disposed between one end of the source electrode S and the drain electrode D (the drain wiring 32) which faces the source electrode S. Thus, comb teeth of one drain electrode D and comb teeth of one source electrode S are completely surrounded by the gate wiring electrode GE. Moreover, it is possible to realize a pattern in which the gate wiring electrode GE (any of the gate electrodes 17, the connection part 22 and the gate wiring 21) is always disposed between the drain electrode D and the source electrode S.

Note that, in FET1-2, arrangement of the source electrode S and the drain electrode D is opposite to that in FET1-1. Specifically, in FET1-2, the connection part 22 is disposed between a tip of the source electrode S and the opposite drain electrode D, and the gate wiring 21 is disposed between a tip of the drain electrode D and the opposite source electrode S.

FET1-3 is the same as FET1-1. Here, drains of FET1-1 and FET1-2 are connected to each other, and the drain wiring 32 is shared therebetween. Moreover, sources of FET1-2 and FET1-3 are connected to each other, and the source wiring 31 is shared therebetween.

Specifically, according to this embodiment, in any of the FETs, the gate wiring electrode GE can be disposed between the source electrode S and the drain electrode D.

Therefore, all the paths in which the high-frequency signal may leak between the source electrode S and the drain electrode D are blocked by the gate wiring electrode GE. Thus, it is possible to prevent the leak of the high-frequency signal between the source electrode S and the drain electrode D.

Particularly, tips of the comb teeth of the source electrode S and the drain electrode D are completely surrounded by the gate wiring electrode GE. Thus, the structure described above is effective as a pattern for preventing the leak of the high-frequency signal and for reducing the third harmonic wave level. Moreover, Pin0.1 dB to be an indication of maximum linear power can be increased.

In the high-power Switch MMIC constituted by the switching element including the plurality of FETs connected to each other in series, the following is found out. Specifically, in the spot where the source electrode and the drain electrode are adjacent to each other and directly face each other, the leak of the high-frequency signal occurs outside the operation region of the FET and the harmonic wave level is increased.

Figure 18:
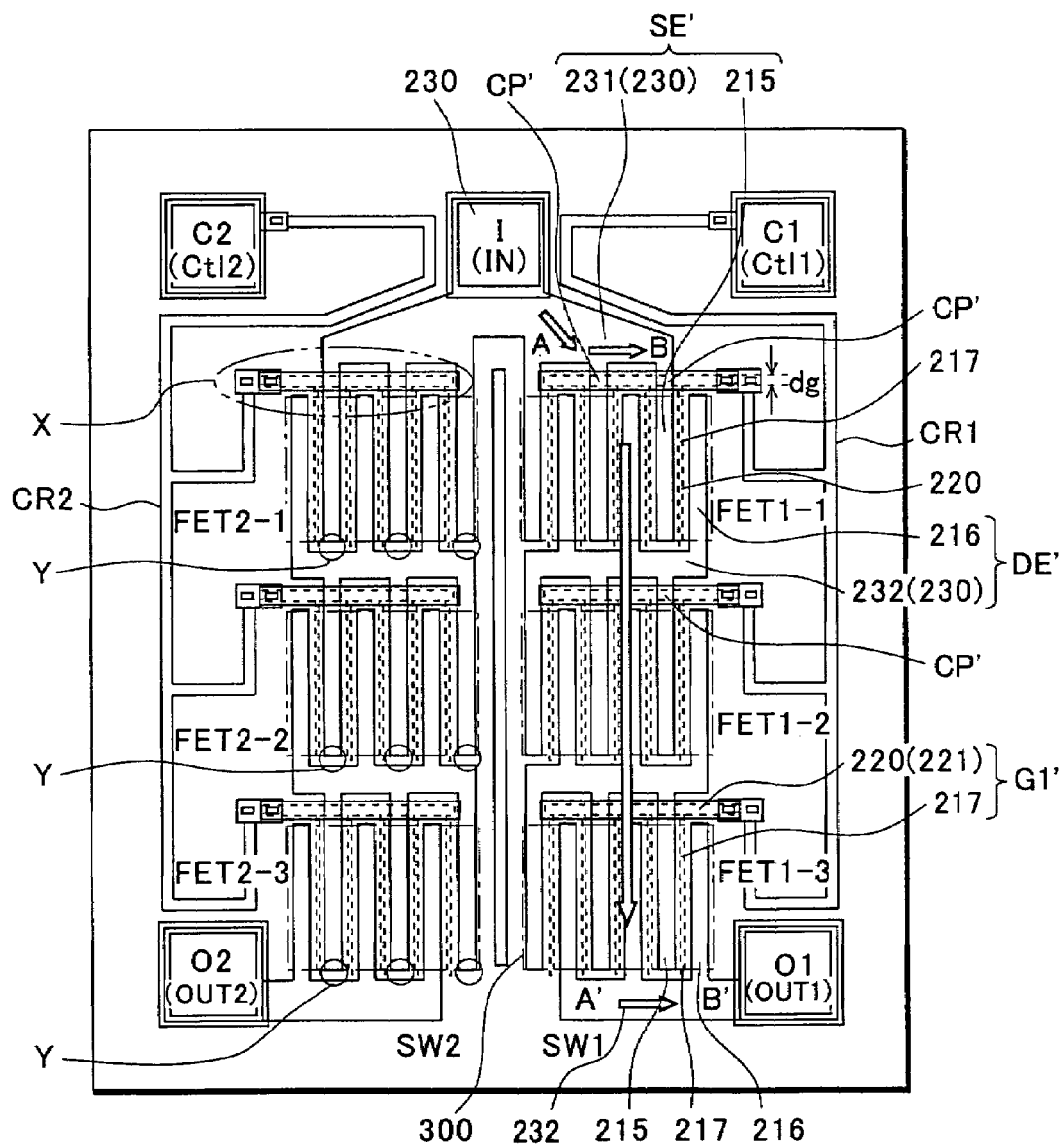
FIG. 18 is a plan view showing the conventional technology.
Figure 19:
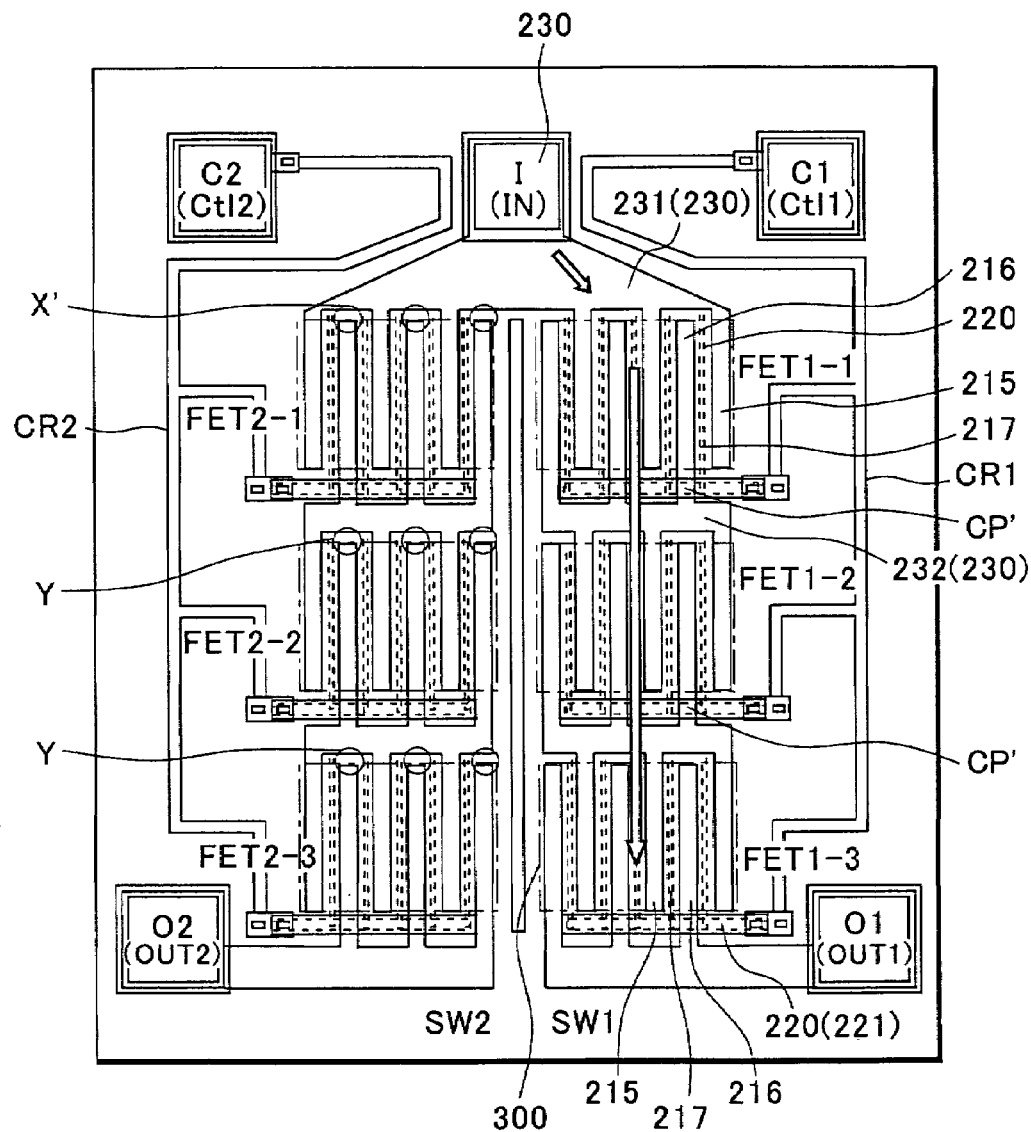
FIG. 19 is a plan view showing the conventional technology.

Specifically, in FIG. 18, leaks of high-frequency signals occur between source electrodes 215 and drain electrodes 216 in the Y regions surrounded by the solid lines, where the source and drain electrodes 215 and 216 are adjacent to each other and directly face each other. In the switching element on the off side, the high-frequency signal hardly passes through the operation region of the FET. However, in the Y regions on the off side, a leak path of the high-frequency signal is formed outside the operation region of the FET. Thus, there is a problem that a designed value for a distortion level of an output signal cannot be secured and a third harmonic wave level is set higher than a predetermined value.

However, in this embodiment, the gate wiring electrode GE is disposed between the source electrode S and the drain electrode D in any regions outside the operation region 100 of the FET. Thus, it is possible to prevent a high-frequency current from flowing through the substrate between the source electrode S and the drain electrode D. Moreover, the leak of the high-frequency signal can be prevented.

With reference to FIG. 4B again, description will be given of a mechanism for preventing the leak of the high-frequency signal.

As shown in FIG. 4B, the one end (tip) of the drain electrode D and the source electrode S (the source wiring 31) are disposed outside of the operation region 100 (on the insulating region 60). The high-frequency signal passes through the drain electrode D and the source wiring 31 on the insulating region 60.

Here, in FIG. 4B, the case where no gate wiring electrode GE is disposed between the source wiring 31 and the drain electrode D is considered (the Y regions in FIG. 18). The high-frequency signal is transmitted to the insulating region 60 through the nitride film 51. As in the case of the nitride film 51, the insulating region 60, as a dielectric material, allows the high-frequency signal to pass therethrough. Specifically, in this case, the leak of the high-frequency signal occurs between the source wiring 31 and the drain electrode D.

Moreover, in the state described above, since the source wiring 31 and the drain electrode D are disposed so as to directly face each other, a direct electric field exists between the source wiring 31 and the drain electrode D. Thus, a leak current of the high-frequency signal flows. In the case of this embodiment, the high-power Switch MMIC is adopted, which includes the switching elements having the plurality of FETs connected to each other in series. Thus, amplitude of the high-frequency signal is large, and amplitude of a high-frequency leak current is also large.

Therefore, as in the case of the Y regions in the conventional technology (FIG. 18), when a drain wiring 232 and the tips of the comb teeth of the source electrodes 215 are disposed so as to face each other, the leak of the high-frequency signal occurs.

Meanwhile, in this embodiment, the connection part 22 of the gate electrodes 17 is disposed between the source wiring 31 and the drain electrode D. Therefore, the leak of the high-frequency signal between the source wiring 31 and the drain electrode D can be blocked by the connection part 22 (the gate wiring electrode GE). Such a mechanism will be described below.

First, the gate wiring electrode GE is connected to the control terminal Ctl through the control resistor CR of 5 KΩ to 10 KΩ (see FIG. 2). A control signal is applied to the control terminal Ctl. Since the control signal is a DC signal, the control terminal is set to be a GND potential of a high-frequency signal. Moreover, the same goes for the case where the gate wiring electrode GE is connected to the point P in the logic circuit L.

In the on-side FET, the gate electrode 17 comes into direct contact with the surface of the operation region 100 and forms a Schottky junction. Specifically, a potential of the gate electrode 17 undergoes high-frequency oscillation under the influence of a high-frequency current flowing through the operating region of the FET. However, in the off-side FET, no current flows through the operating region. Therefore, the potential of the surface of the operation region 100 hardly undergoes the high-frequency oscillation. Specifically, the gate electrode 17 never undergoes the high-frequency oscillation unlike the on-side FET, and can be virtually regarded as the GND potential of the high-frequency signal as in the case of the control terminal Ctl.

Therefore, by disposing the connection part 22 between the source electrode S (the source wiring 31) and the drain electrode D in the off-side FET, the source electrode S, the GND potential as the high-frequency signal and the drain electrode D are arranged in this order on a straight line.

In the case where no connection part 22 is disposed, a direct electric field of the high-frequency signal exists between the source electrode S and the drain electrode D. However, by sandwiching the GND potential as the high-frequency signal between the both electrodes, the direct electric field therebetween is significantly weakened. Therefore, it is possible to prevent the high-frequency current from flowing through the substrate between the source electrode S and the drain electrode D. Moreover, the leak of the high-frequency signal can be prevented. Particularly, in the high-power Switch MMIC constituted by the switching element including the plurality of FETs connected to each other in series, the amplitude of the high-frequency signal is large. Therefore, a strong electric field of the high-frequency signal is generated between the source electrode S and the drain electrode D. Thus, in the case where no connection part 22 is disposed, a large high-frequency current flows. In this embodiment, the leak of the high-frequency signal can be prevented even in the high-power Switch MMIC constituted by the switching element including the plurality of FETs connected to each other in series.

The mechanism described above is the same on the gate wiring 21 side. Specifically, on the gate wiring 21 side, as shown in FIG. 3A, a leak of a high-frequency signal between the drain wiring 32 (the drain electrode D) and the source electrode S can be prevented by the gate wiring 21.

As described above, according to this embodiment, on all the paths in which the high-frequency signal may leak between the source electrode S and the drain electrode D, the gate wiring electrode GE is disposed. Thus, it is possible to prevent the leak of the high-frequency signal between the source electrode S and the drain electrode D.

Secondly, in the portion outside the operation region 100, the gate wiring electrode GE comes into direct contact with the substrate and forms a Schottky junction. Therefore, the high-frequency signal leaking through the insulating region 60 can be directly absorbed. Thus, the leak of the high-frequency signal between the source electrode S and the drain electrode D can be more significantly prevented.

The two mechanisms described above similarly function also in the case where the gate wiring 21 and the connection part 22 are disposed within the operation region 100. Specifically, the leak of the high-frequency signal between the source electrode S and the drain electrode D can be prevented by sandwiching the gate wiring 21 and the connection part 22 within the operation region 100.

Particularly, in the DPDT Switch MMIC, there may be the case where input and output of a signal are reversed. Accordingly, the first RF ports and the second RF ports may be replaced with each other and used. In this embodiment, even if transmission of the high-frequency signal is reversed, all leak paths of the high-frequency signal, which have heretofore been formed between the source electrode S and the drain electrode D, can be completely blocked. Specifically, no matter which terminals pads of the RF ports become input terminal pads having the largest amplitude of the high-frequency signal, the leak of the high-frequency signal can be completely prevented. Thus, Pin0.1 dB and distortion characteristics (the third harmonic wave level) as designed can be obtained.

To be more specific, for example, in FIG. 18, it has heretofore been possible to prevent a leak of a high-frequency signal by a gate wiring 221 in FET1-1 or FET2-1, the high-frequency signal having the largest amplitude immediately after being inputted from the common input terminal pad I.

Specifically, in any of the off-side FETs, the leak of the high-frequency signal between the source electrode S and the drain electrode D can be prevented in only the portion where the gate wiring 221 is disposed.

However, on the other hand, in the case where a high-frequency signal is inputted, for example, from the common output terminal pad O1 or O2, a large leak of the high-frequency signal occurs in a portion immediately after the high-frequency signal having the largest amplitude is inputted in any of the off-side FETs such as FET1-3 and FET2-3. The portion immediately after the high-frequency signal having the largest amplitude is inputted is a portion between the source electrode S and the drain electrode D, which corresponds to the Y region.

In this embodiment, the gate wiring electrode GE (the connection part 22) is also disposed in the spot corresponding to the Y region. Thus, even if the high-frequency signal is inputted from any of the terminal pads including the input terminal pad and the output terminal pad, the leak of the high-frequency signal between the source electrode S and the drain electrode D can be prevented by the gate wiring electrode GE. Consequently, the third harmonic wave level is significantly improved.

Here, in order to prevent the leak of the high-frequency signal, as shown in FIG. 3A, it is preferable that the gate wiring electrode GE is disposed continuously without interruption for the leak path between the source electrode S and the drain electrode D. However, in the case of such a closed-loop shape, an accurate pattern may not be formed. The gate wiring electrode GE is formed by lift-off process. Specifically, in the lift-off, a resist remover is allowed to seep into a resist below the unnecessary gate metal layer 20, and the gate metal layer 20 is removed together with the resist. In this event, if the gate wiring electrode GE is continuous, the resist remover may not sufficiently seep into the resist.

Specifically, in the case where pattern formation of the gate wiring electrode GE having the closed-loop shape as shown in FIGS. 3A and 3B is performed by the lift-off, there is a problem that it is usually difficult to perform the lift-off since the resist remover cannot seep into the loop from outside of the loop. However, in this embodiment, the lift-off can be performed, and the accurate pattern can be formed.

Figure 7:
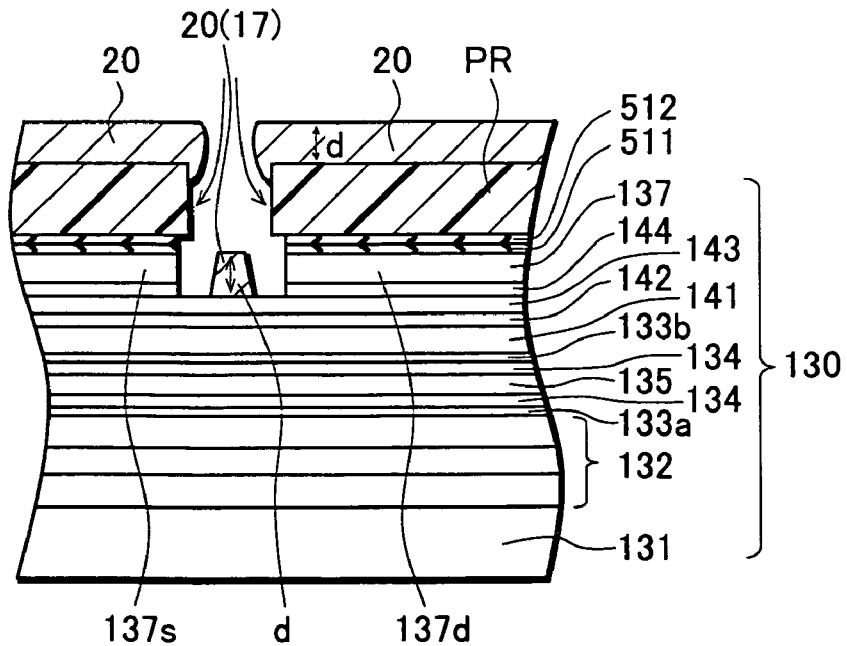
FIG. 7 is a cross-sectional view showing the first embodiment of the present invention.

FIG. 7 is a cross-sectional view around the gate electrode 17 after the gate metal layer 20 is evaporated in the cross section shown in FIG. 3B, for example. Only in the case of the Switch MMIC, the control resistor CR of about 5 KΩ to 10 KΩ or more is connected to the gate electrode 17. Thus, there is no problem even if the gate electrode 17 has a somewhat large resistance value. Specifically, a metal evaporated film thickness d of the gate metal layer 20 can be reduced (to about 100 Å). When the evaporated film thickness d is reduced as described above, edges of a resist mask PR always disconnect the gate metal layer 20. Therefore, the resist remover sufficiently seeps into the resist PR below the gate metal layer 20 from a disconnected portion (as indicated by the arrows). Thus, the lift-off can be performed without any problem even if the closed-loop shape is adopted.

Next, a second harmonic wave level will be described.

In the conventional pattern shown in FIG. 18, the case where the second switching element SW2 is on and the first switching element SW1 is off is considered. When a high-frequency signal inputted from the common input terminal pad I leaks into FET1-1 turned off, first, the signal passes on a source wiring 231 from a point A to a point B as indicated by the arrow. Accordingly, a phase shift occurs while the signal is transmitted from the point A to the point B.

The high-frequency signal which has leaked into FET1-1 is transmitted to FET1-3. Even if FET1-1 to FET1-3 are off, the high-frequency signal inputted from the common input terminal pad I leaks into the output terminal pad O1, while being attenuated for isolation level, through a depletion layer capacitance extended below the gate electrodes in each FET. Specifically, in FIG. 18, the phase shift between the point A and the point B is directly set to be a phase shift between a point A' and a point B' on the drain wiring 232 in FET1-3. Moreover, signals having different phases at the points A' and B' are synthesized on the drain wiring 232 in FET1-3 and outputted from the output terminal pad O1.

As described above, in the case where the high-frequency signal inputted from the common input terminal pad I leaks into the output terminal pad O1 through the first switching element SW1 turned off, when a phase shift occurs inside of the first switching element SW1, a second harmonic wave level of the Switch MMIC is increased. Meanwhile, in FIG. 2 of this embodiment, the case where the first switching element SW1 is off is considered. When a high-frequency signal inputted from the common input terminal pad I1 leaks into FET1-1 turned off, first, the signal passes on the source wiring 31 from a point C to a point D as indicated by the arrow. Accordingly, a phase shift occurs while the signal is transmitted from the point C to the point D. The high-frequency signal which has leaked into FET1-1 is transmitted to FET1-3.

Here, since the gate wiring electrode GE of this embodiment has the ladder-like pattern, the phase of the entire gate wiring electrode GE is uniform, unlike a conventional comb-shaped gate wiring electrode G1' as shown in FIG. 18. In FET1-1 to FET1-3 which are off, the high-frequency signal leaks through the depletion layer capacitance extended below the gate electrodes 17 in each FET. However, since the phase of the entire gate wiring electrode GE is uniform, the phase shift between the points C and D is corrected to match the phases while the signal leaks into FET1-1 to FET1-3.

Therefore, a phase shift between a point C' and a point D' on the drain wiring 32 in FET1-3 is eliminated. Specifically, when the high-frequency signal inputted from the input terminal pad I1 leaks into the output terminal pad O1 through the first switching element SW1 turned off, no phase shift occurs inside of the first switching element SW1. Thus, the second harmonic wave level of the Switch MMIC is never increased.

For example, in the conventional pattern shown in FIG. 18, at a cross part CP', the gate wiring 221 intersects with the source electrodes 215 or the drain electrodes 216 with a nitride film (not shown) interposed therebetween. However, as a result of an experiment, it was found out that the second harmonic wave level is deteriorated by use of the pattern of the gate wiring electrode G1' (the gate wiring 221 and the gate electrodes 217) in FIG. 18.

This is considered to be partly because of the following reason. Specifically, in the case where the first switching element SW1 is the off-side switching element, for example, the high-frequency signal passing through the source electrodes 215 or the drain electrodes 216 leaks into the gate wiring 221 through the nitride film at the cross part CP'.

Figure 5:
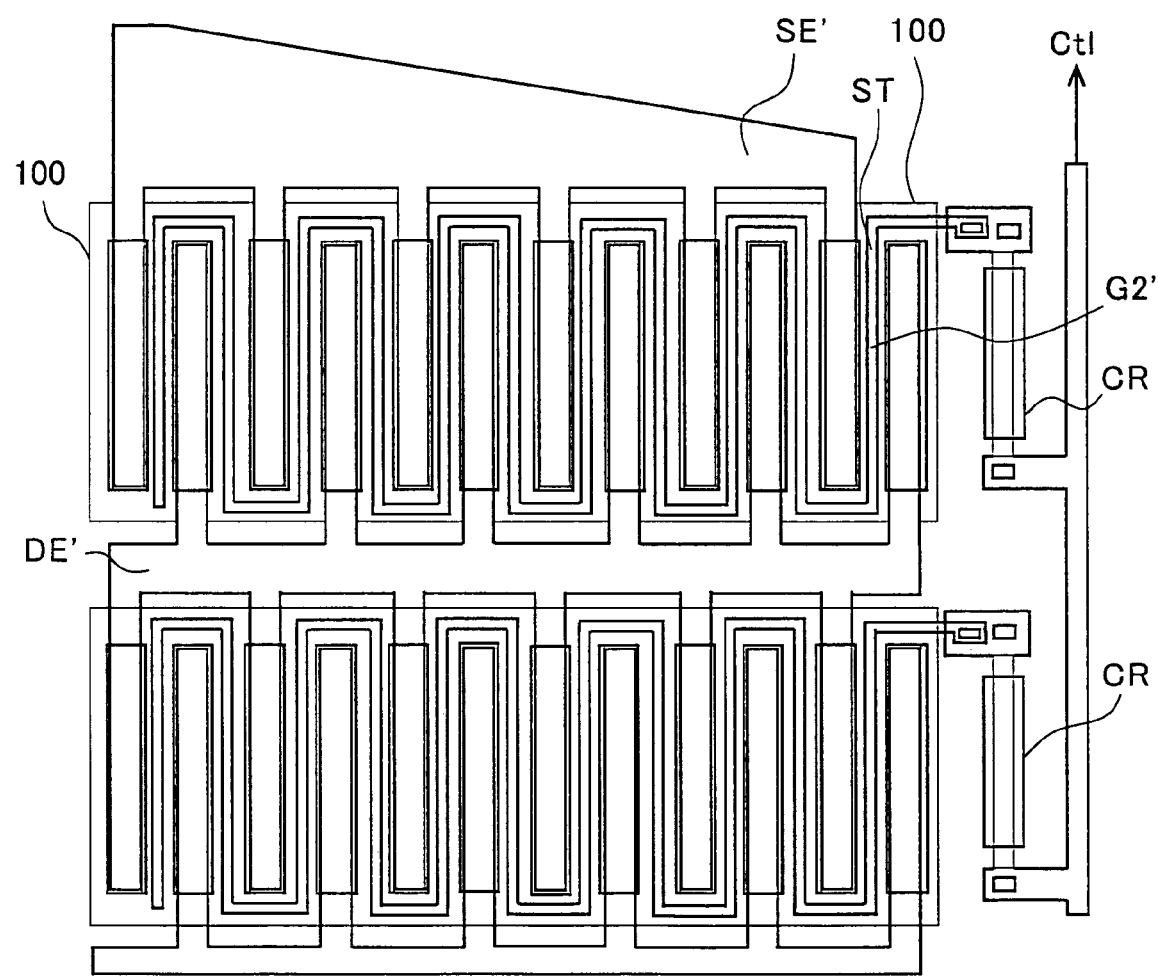
FIG. 5 is a plan view for comparing the embodiment of the present invention with a conventional technology.

FIG. 5 shows a pattern of another gate wiring electrode G2' for comparing with the pattern of the gate wiring electrode GE of this embodiment. FIG. 5 shows an example of a Switch MMIC having a pattern (hereinafter referred to as a meander shape) in which the one gate wiring electrode G2' is bent and extended between a source wiring electrode SE' and a drain wiring electrode DE'.

In this case, no cross part exists between the source wiring electrode SE' or the drain wiring electrode DE' and the gate wiring electrode G2'. Thus, it is known that a second harmonic wave level is low as described later. Moreover, in the Switch MMIC, the meander-shaped pattern of the gate wiring electrode G2' is often adopted.

However, there is a problem that the pattern described above is very vulnerable to static electricity applied between a gate and a drain or between the gate and a source from the outside. This is because, in the case of such a pattern of the gate wiring electrode G2', electrostatic energy applied to a control terminal Ctl is concentrated on a starting point ST (a portion closest to a control resistor CR) of the gate wiring electrode G2' on an operation region 100. Therefore, in the gate wiring electrode G2' as described above, the starting point ST portion of the gate wiring electrode G2' is destroyed at a low electrostatic voltage. Thus, as a result, an electrostatic breakdown voltage is set low in the Switch MMIC. Consequently, the pattern described above is not desirable in terms of reliability.

Figure 6:
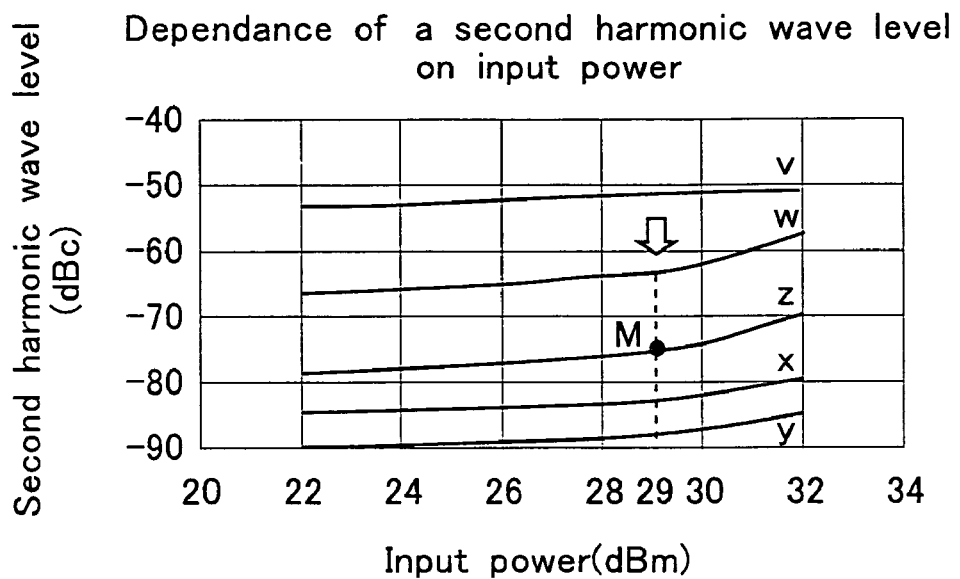
FIG. 6 is a characteristic diagram for explaining the embodiment of the present invention.

FIG. 6 shows dependence of a second harmonic wave level on input power in each of the patterns of the gate wiring electrode GE of this embodiment and the gate wiring electrodes G1' and G2' having the conventional structures shown in FIGS. 18 and 5. Solid lines v and w indicate the case of the pattern shown in FIG. 18. The solid line v indicates the case of a gate wiring width dg=5 μm, and the solid line w indicates the case of the gate wiring width dg=1 μm. A point M indicates the case where the Switch MMIC as shown in FIG. 18 is formed by use of the meander-shaped pattern shown in FIG. 5. A solid line x indicates the case of this embodiment shown in FIGS. 3A and 3B, in which the gate wiring width dg is set to 5 μm. Note that, since, here, a comparison is made on input power of 29 dBm in particular, only the point M indicates the case of the meander shape.

In the comb-shaped pattern of the gate wiring electrode G1' as in the conventional structure (FIG. 18), a second harmonic wave level at the input power of 29 dBm is −51 dBc (the solid line v in FIG. 6) in the case of the gate wiring width dg=5 μm and is −62 dBc (the solid line w in FIG. 6) in the case of the gate wiring width dg=1 μm. Specifically, by reducing the gate wiring width dg, the second harmonic wave level is improved by about 10 dBc as indicated by the arrow.

Meanwhile, in the case of the meander-shaped pattern of the gate wiring electrode G2' shown in FIG. 5, the second harmonic wave level at the input power of 29 dBm is −75 dBc (the point M), which reaches a required level as the second harmonic wave level. This is because no cross part exists between the gate wiring electrode G2' and the source wiring electrode SE' or the drain wiring electrode DE' as described above.

Based on the data described above, it is found out that, in the FET used for the Switch MMIC, the smaller the parasitic capacitance between the source wiring electrode SE' or the drain wiring electrode DE' and the gate wiring electrode G1' or G2', the lower the second harmonic wave level. Specifically, it can be said that a second harmonic wave level is worsened partly because the high-frequency signal passing through the source wiring electrode or the drain wiring electrode leaks into the gate wiring electrode (the gate wiring) through the nitride film in the FET.

In other words, the second harmonic wave level can be improved by reducing the area of the cross parts CP' in the entire Switch MMIC and by reducing the parasitic capacitance. However, in the current Switch MMIC, a minimum value of the gate wiring width is about 1 μm so as not to increase a resistance value of the gate wiring too much. It is not realistic to further reduce the gate wiring width. Moreover, even if the gate wiring width is reduced to 1 μm, improvement of the second harmonic wave will not reach a sufficient level.

To be more specific, the second harmonic wave level is −62 dBc in the case where the gate wiring width is 1 μm at the input power of 29 dBm. However, in a CDMA (Code Division Multiple Access) cellular-phone unit, it is required to prevent interference during calls. A Switch MMIC used for the cellular-phone described above is required to have a second harmonic wave level of −75 dBc or lower in the case where power of about 29 dBm is inputted. Specifically, in the case of the gate wiring electrode G1' shown in FIG. 18, even if the parasitic capacitance is reduced by reducing the gate wiring width dg to 1 μm, for example, the required level is not yet achieved. Moreover, in the case of the comb-shaped pattern, about 1 μm is a limit value of reduction in the gate wiring width dg. It is difficult to further reduce the gate wiring width.

Meanwhile, in the meander-shaped pattern of the gate wiring electrode G2' which shows a sufficiently low value of the second harmonic wave level, there is a problem that the pattern is vulnerable to electrostatic breakdown as described above. Thus, the pattern cannot be employed in a product for which high reliability is required.

On the other hand, according to this embodiment, as indicated by the solid line x, the second harmonic wave level is −82 dBc at the input power of 29 dBm. This level is lower than that in the meander-shaped pattern of the gate wiring electrode G2'. The reason why such a very good level can be obtained is as described above.

In this embodiment, the gate wiring width dg is 3 μm to 5 μm. Specifically, the second harmonic wave level can be lowered as indicated by the solid line x by setting the gate wiring width dg=5 μm without adopting a method for reducing the gate wiring width dg to reduce the capacitance at the cross part CP. To be more specific, the second harmonic wave level is set to −82 dBc at the input power of 29 dBm without increasing the gate resistance and without causing patterning failure and the like attributable to the reduction in the gate wiring width. Thus, it is possible to realize a second harmonic wave level sufficient for the Switch MMIC used in the CDMA cellular-phone unit.

Furthermore, in this embodiment, the plurality of gate electrodes 17 are bundled by the gate wiring 21. Thus, the electrostatic energy applied to the control terminal Ctl can be distributed throughout the FET through the gate wiring 21. Therefore, it is possible to sufficiently increase resistance to the electrostatic breakdown and to realize a second harmonic wave level lower than that in the meander-shaped pattern.

As FET1-1 has been described above, exactly the same goes for FET1-2 and FET1-3.

As described above, according to this embodiment, the both of second and third harmonic wave levels can be reduced. Thus, distortion characteristics as designed can be obtained. In the Switch MMIC, predetermined distortion characteristics cannot be obtained unless the both of second and third harmonic wave levels are reduced. In other words, the predetermined distortion characteristics cannot be obtained by reducing either one of the second and third harmonic wave levels. In the Switch MMIC, it is very effective for improvement in the distortion characteristics to combine the two measures described above, as in the case of this embodiment.

Figure 8A:
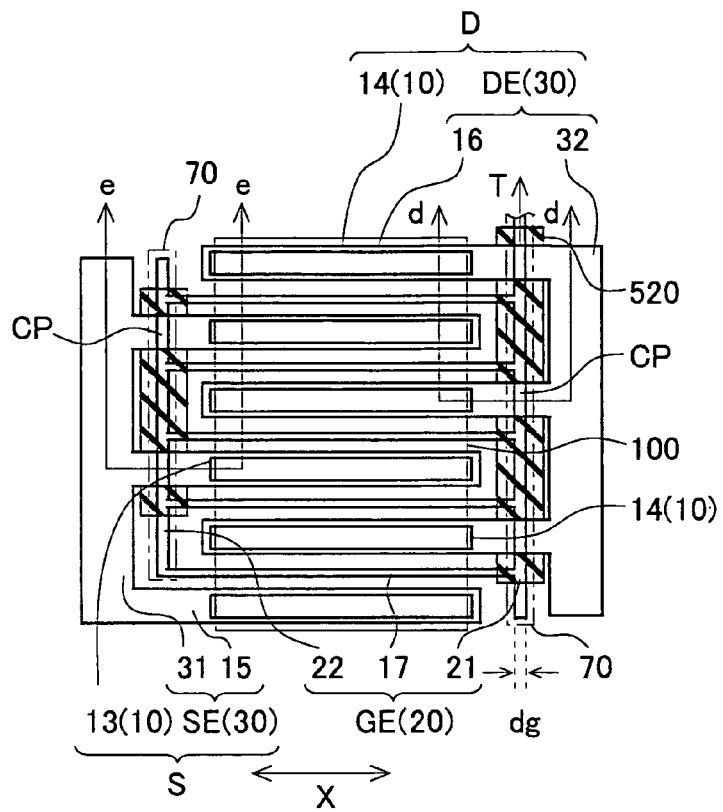
FIG. 8A is a plan view and FIG. 8B is a cross-sectional view showing a second embodiment of the present invention.
Figure 8B:
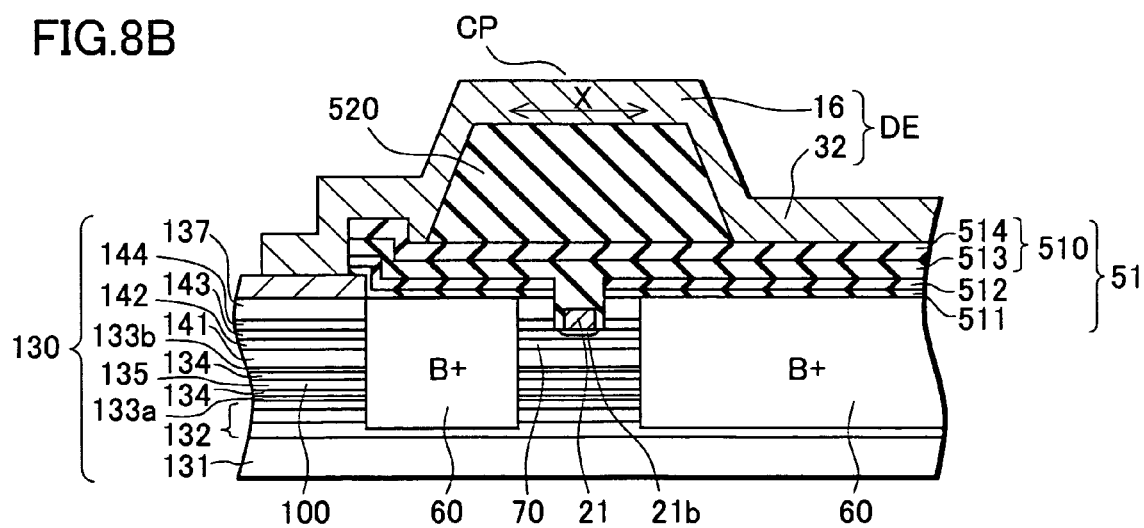

FIGS. 8A and 8B show a second embodiment. In the second embodiment, the capacitance at the cross part CP in the first embodiment is reduced. FIG. 8A is an enlarged plan view of FET1-1, and FIG. 8B is a cross-sectional view along the line d-d in FIG. 8A. Moreover, a cross section along the line e-e in FIG. 8A has a configuration in which a gate wiring 21 is set to be a connection part 22 and a drain wiring electrode DE is set to be a source wiring electrode SE in FIG. 8B. Thus, the showing is omitted in the drawing. Moreover, description of the same constituent components as those of the first embodiment will be omitted.

The gate wiring 21 and the drain wiring electrode DE (specifically, second drain electrodes 16) intersect with each other at a cross part CP. Similarly, the connection part 22 and the source wiring electrode SE (second source electrodes 15) intersect with each other at a cross part CP. As described above, reduction in the capacitance at the cross part CP is effective for reduction in a second harmonic wave level (see FIG. 6). However, reduction in the gate wiring width dg has its limits.

Accordingly, in the second embodiment, first and second insulating films 510 and 520 are disposed as indicated by hatching between the second drain electrodes 16 and the gate wiring 21 at least at the cross part CP. As the second drain electrodes 16 and the gate wiring 21 will be described below, the same goes for the second source electrodes 15 and the connection part 22.

The gate wiring 21 and the second drain electrode 16 are extended in directions perpendicular to each other. On the gate wiring 21, the first insulating film 510 having a large relative dielectric constant and the second insulating film 520 having a small relative dielectric constant are disposed. The second drain electrode 16 intersects with the gate wiring 21 on the first and second insulating films 510 and 520. The first insulating film 510 is at least one nitride film, for example. The first and second insulating films 510 and 520 will be described in detail below.

On a surface of a cap layer 137 around the gate wiring 21 (similarly, gate electrodes 17 and the connection part 22), first to fourth nitride films 511 to 514 to be respective masks or passivation films are laminated. The gate wiring 21 and a third undoped layer 143 exposed therearound are covered with the third and fourth nitride films 513 and 514. A thickness of each of the third and fourth nitride films 513 and 514 is about 1500 Å. In this embodiment, description is given by taking the case where a nitride film 510 to be the first insulating film is formed of the third and fourth nitride films 513 and 514, as an example. However, as described above, the first insulating film 510 may be formed of at least one insulating film having a relative dielectric constant larger than that of the second insulating film 520.

Furthermore, above the gate wiring 21, a polyimide 520 having a thickness of about 2 μm is disposed along the gate wiring 21. Specifically, the first insulating film 510 (the nitride film: relative dielectric constant ∈s1=7.5), which is formed of the third and fourth nitride films 513 and 514, is disposed on the gate wiring 21 at least at the cross part CP, and the second insulating film 520 (the polyimide: relative dielectric constant ∈s2=3.2) is laminated thereon. The second drain electrode 16 is extended in the direction perpendicular to the extending direction of the gate wiring 21. Moreover, a drain wiring 32 connected to the second drain electrode 16 is extended parallel to the gate wiring 21.

In FIGS. 8A and 8B, a flow of a high-frequency signal is indicated by an arrow X. Specifically, in the second embodiment, the thick polyimide 520 having a small relative dielectric constant can sufficiently reduce a parasitic capacitance at the cross part CP between the gate wiring 21 and the second drain electrode 16 through which the high-frequency signal is transmitted. Thus, it is possible to prevent occurrence of a leak of the high-frequency signal without reduction in a gate wiring width dg.

In the first embodiment, as shown in FIG. 4A, the second drain electrode 16 and the gate wiring 21 intersect with each other with the third nitride film 513 interposed therebetween at the cross part CP. The third nitride film 513 has a thickness of 1500 Å.

Specifically, between the gate wiring 21 and the second drain electrode 16 through which the high-frequency signal flows, only the third nitride film 513 having a large relative dielectric constant is disposed in the thickness of 1500 Å. Therefore, the parasitic capacitance therebetween is increased. Accordingly, a leak of the high-frequency signal may occur.

To be more specific, a capacitance value C1 between the gate wiring 21 and the second drain electrode 16 in the structure of the first embodiment (FIGS. 3A and 3B) is compared with a capacitance value C2 between the gate wiring 21 and the second drain electrode 16 in the structure of the second embodiment (FIGS. 8A and 8B). The capacitance values C are obtained by the following equation.

$$C = \epsilon_0 \cdot \epsilon_S \cdot S/d$$

Here, $\epsilon_0$ is a vacuum dielectric constant (F/cm), $\epsilon_S$ is a relative dielectric constant, S is an area (cm$^2$), and d is a thickness (cm). Moreover, the capacitance values are those obtained when a gate wiring width dg is set to 1 μm and a gate wiring length is set to 100 μm.

In the case of the first embodiment, only the third nitride film 513 is disposed between the gate wiring 21 and the second drain electrode 16. Therefore, the capacitance value C1=(8.85E-14×7.5×100E-8)/1500E-8=44.3 fF is established.

Meanwhile, in the case of the second embodiment, the first insulating film (the third and fourth nitride films) 510 and the second insulating film (polyimide) 520 are disposed between the gate wiring 21 and the second drain electrode 16. A capacitance value C21 of the first insulating film 510 is (8.85E-14×7.5×100E-8)/3000E-8=22.1 fF, and a capacitance value C22 of the second insulating film 520 is (8.85E-14×3.2×100E-8)/2E-4=1.42 fF. Therefore, a total capacitance value C2 is set to be 1/(1/22.1+1/1.42)=1.33 fF.

Specifically, according to the second embodiment, the capacitance value C2 is only 3% of the capacitance value C1 in the case where only the third nitride film 513 is disposed as in the case of the first embodiment. Thus, the parasitic capacitance at the cross part CP can be significantly reduced.

Note that, although not shown in the drawings, the polyimide layer that is the second insulating film 520 is disposed for preventing short-circuiting between first and second wiring metal layers 30 and 40 at a cross part therebetween such as a portion h in FIG. 2, for example. Moreover, the polyimide layer 520 for preventing the short-circuiting is also disposed in the conventional structure. Furthermore, the fourth nitride film 514 is an interlayer insulating film between the first and second wiring metal layers 30 and 40. Specifically, the second embodiment can be realized only by changing a mask for forming the polyimide layer 520 so as to dispose the polyimide layer also on the gate wiring 21 and the connection part 22.

As described above, the parasitic capacitance can be reduced by providing the second insulating film 520, having the small relative dielectric constant at the cross part CP. Accordingly, it is possible to prevent the leak of the high-frequency signal between the source electrode S and the gate wiring electrode GE or between the drain electrode D and the gate wiring electrode GE. Thus, a second harmonic wave level can be further reduced.

To be more specific, a solid line y in FIG. 6 indicates the second harmonic wave level of the second embodiment. As described above, according to the second embodiment, at the input power of 29 dBm, the second harmonic wave level can be lowered by about 6 dB compared with that of the first embodiment.

In the second embodiment, the second source electrode 15 and the second drain electrode 16 are formed of the second wiring metal layer 40. Specifically, with reference to FIG. 3B, the second source electrode 15 and the second drain electrode 16 are formed of the first wiring metal layer 30 in the first embodiment. However, the first wiring metal layer 30 is replaced with the second wiring metal layer 40 in the second embodiment. Therefore, in the second embodiment, the fourth nitride film 514 that is the interlayer insulating film between the first and second wiring metal layers 30 and 40 is provided below the second source electrode 15 and the second drain electrode 16, as in the case of the third nitride film 513 in FIG. 3B.

With reference to the cross-sectional view of FIG. 3B, the fourth nitride film 514 is disposed on the third nitride film 513 also on an operation region 100 in the second embodiment. Specifically, the gate electrode 17 and the surface of the third undoped layer 143 exposed therearound are covered with the third and fourth nitride films 513 and 514. Moreover, a first source electrode 13 and a first drain electrode 14 are covered with the first to fourth nitride films 511 to 514, and come into contact with the second source electrode 15 and the second drain electrode 16, respectively, through contact holes provided in the nitride films.

The configuration other than the above is the same as that of the first embodiment. Specifically, the gate wiring electrode GE is formed into a ladder-like pattern and is disposed between the source electrode S and the drain electrode D. Accordingly, the leak of the high-frequency signal between the source electrode S and the drain electrode D is prevented. Thus, a third harmonic wave level can be lowered.

In the second embodiment, the description has been given of the case where the first insulating film 510 having the large relative dielectric constant is formed of the third and fourth nitride films 513 and 514. However, as described above, the configuration of the first insulating film 510 is not limited to that described above. Specifically, the first insulating film 510 may be at least one insulating film having a relative dielectric constant larger than that of the second insulating film 520. For example, the first insulating film 510 may be formed of one nitride film or may be formed of three nitride films or more. Furthermore, the first insulating film 510 may be formed of other insulating films such as an oxide film without being limited to the nitride film.

Figure 9A:
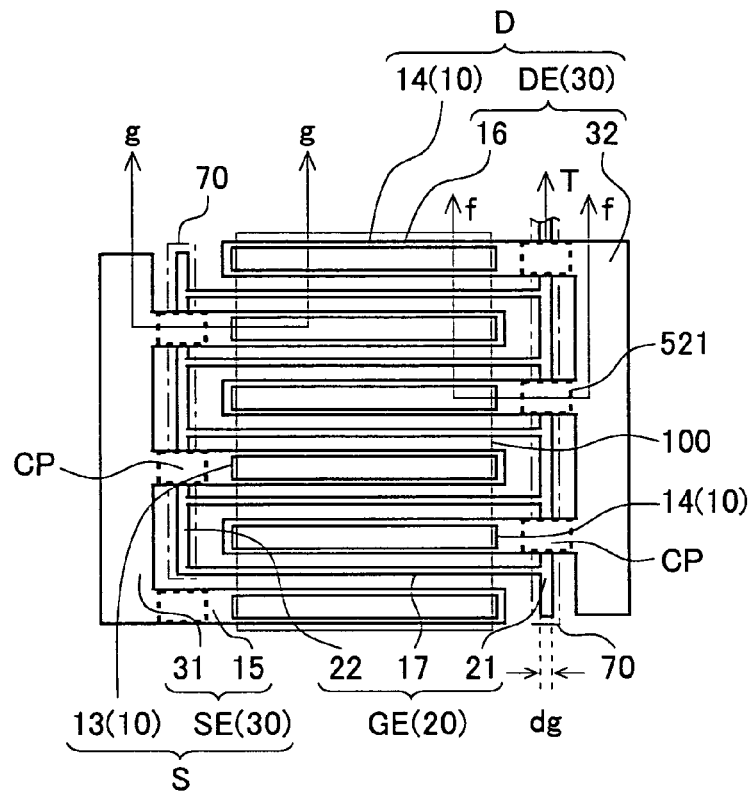
FIG. 9A is a plan view and FIG. 9B is a cross-sectional view showing a third embodiment of the present invention.
Figure 9B:
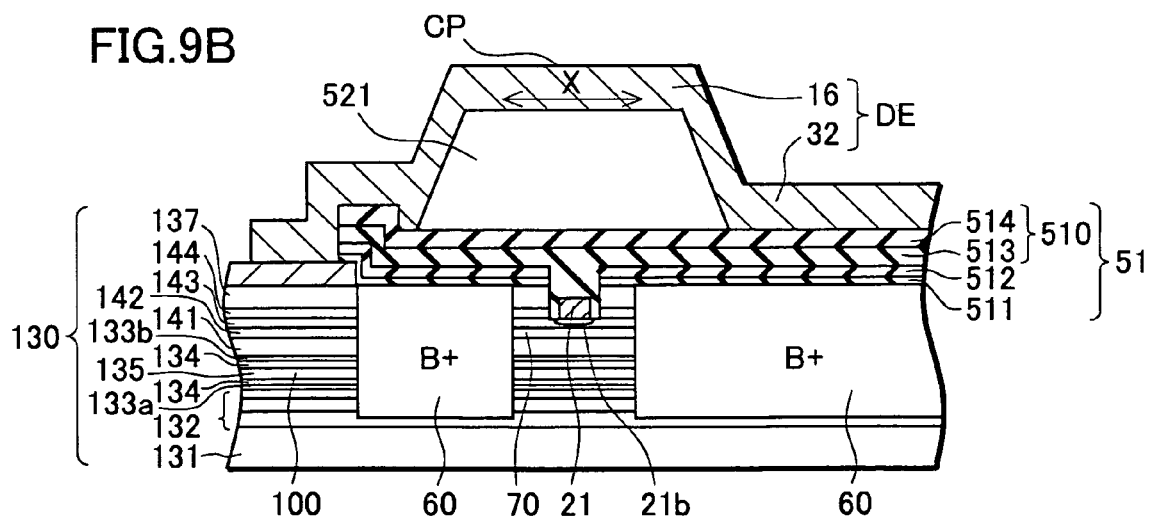

FIGS. 9A and 9B show a third embodiment. The third embodiment is another embodiment for reducing the capacitance at a cross part CP. FIG. 9A is an enlarged plan view of FET1-1, and FIG. 9B is a cross-sectional view along the line f-f in FIG. 9A. Moreover, a cross section along the line g-g in FIG. 9A has a configuration in which a gate wiring 21 is set to be a connection part 22 and a drain wiring electrode DE is set to be a source wiring electrode SE in FIG. 9B. Thus, the showing is omitted in the drawing. Moreover, description of the same constituent components as those of the first and second embodiments will be omitted.

A second drain electrode 16 and the gate wiring 21 intersect with each other at the cross part CP. At the cross part CP, a hollow part 521 is disposed as indicated by a thick broken line between the second drain electrode 16 and the gate wiring 21. As the second drain electrode 16 and the gate wiring 21 will be described below, the same goes for a second source electrode 15 and the connection part 22.

On the gate wiring 21 at the cross part CP, an insulating film 510 having a large relative dielectric constant and the hollow part 521 having a small relative dielectric constant are disposed, on which the second drain electrode 16 intersects with the gate wiring 21. The insulating film 510 is at least one nitride film, for example. The insulating film 510 and the hollow part 521 will be described below.

On a surface of a cap layer 137 around the gate wiring 21 (similarly, a gate electrode 17 and the connection part 22), first to fourth nitride films 511 to 514 to be respective masks or passivation films are laminated. The gate wiring 21 and a third undoped layer 143 exposed therearound are covered with the third and fourth nitride films 513 and 514. A thickness of each of the third and fourth nitride films 513 and 514 is about 1500 Å. In this embodiment, description is given by taking the case where the insulating film 510 is formed of the third and fourth nitride films 513 and 514, as an example. However, as described above, the insulating film 510 may be formed of at least one insulating film having a relative dielectric constant larger than that of the hollow part 521.

The insulating film 510 is superposed on the gate wiring 21 and disposed thereon. At the cross part CP between the gate wiring 21 and the drain wiring electrode DE, the hollow part 521 is disposed on the insulating film 510. The hollow part 521 is a so-called air bridge formed by leaving air between the drain wiring electrode DE and the insulating film 510. Specifically, the hollow part 521 is formed in such a manner that another resist film is formed on a resist film (not shown) and the resist film is removed after evaporation and lift-off of the drain wiring electrode DE. The hollow part 521 has a thickness (height) of about 2 μm. Specifically, the insulating film 510 (in the case of nitride films: a relative dielectric constant $\in$s1=7.5), which is formed of the third and fourth nitride films 513 and 514, is disposed on the gate wiring 21 at the cross part CP, and the hollow part 521 (a relative dielectric constant $\in$s2=1) is disposed thereon. The second drain electrode 16 is extended in a direction perpendicular to the extending direction of the gate wiring 21. Moreover, a drain wiring 32 connected to the second drain electrode 16 is extended parallel to the gate wiring 21.

In FIGS. 9A and 9B, a flow of a high-frequency signal is indicated by an arrow X. Specifically, in the third embodiment, the thick hollow part 521 having the small relative dielectric constant can sufficiently reduce a parasitic capacitance at the cross part CP between the gate wiring 21 and the second drain electrode 16 through which the high-frequency signal is transmitted. Thus, it is possible to prevent occurrence of a leak of the high-frequency signal without reduction in a gate wiring width dg.

To be more specific, a capacitance value C3 between the gate wiring 21 and the second drain electrode 16 in the structure of the third embodiment (FIGS. 9A and 9B) is compared with a capacitance value C1 between the gate wiring 21 and the second drain electrode 16 in the structure of the first embodiment (FIGS. 3A and 3B).

In the case of the third embodiment, the insulating film (the third and fourth nitride films 513 and 514) 510 and the hollow part 521 are disposed between the gate wiring 21 and the second drain electrode 16. A capacitance value C31 of the insulating film 510 is (8.85E-14×7.5×100E-8)/3000E-8=22.1 fF, and a capacitance value C32 of the hollow part 521 is (8.85E-14×1×100E-8)/2E-4=0.443 fF. Therefore, the total capacitance value C3 is set to be 1/(1/22.1+1/0.443)=0.434 fF.

Meanwhile, in the case of the first embodiment, as described above, the capacitance value C1 is set to be (8.85E-14×7.5×100E-8)/1500E-8=44.3 fF.

Specifically, according to the third embodiment (FIGS. 9A and 9B), the capacitance value C3 is only 1% of the capacitance value C1 in the first embodiment. Thus, the parasitic capacitance at the cross part CP can be significantly reduced.

Note that, although not shown in the drawings, the hollow part 521 is disposed in the portion h in FIG. 2, for example, for preventing short-circuiting between a first and second wiring metal layers 30 and 40 at the cross part therebetween. Moreover, the hollow part 521 for preventing the short-circuiting is also disposed in the conventional structure. The third embodiment can be realized only by changing a mask for forming the hollow part 521 so as to dispose the hollow part also on the gate wiring 21 and the connection part 22.

As described above, the parasitic capacitance can be reduced by providing the hollow part 521 having the small relative dielectric constant at the cross part CP. Accordingly, it is possible to prevent the leak of the high-frequency signal between the source electrode S and the gate wiring electrode GE or between the drain electrode D and the gate wiring electrode GE. Thus, a second harmonic wave level can be further reduced.

To be more specific, as in the case of the second embodiment, the solid line y in FIG. 6 indicates the second harmonic wave level of this embodiment. As described above, at the input power of 29 dBm, the second harmonic wave level can be lowered by about 6 dB compared with that of the first embodiment.

Moreover, an operation region 100 is the same as that of the second embodiment, and the configuration other than the above is the same as that of the first embodiment. Specifically, the gate wiring electrode GE is formed into a ladder-like pattern and is disposed between the source electrode S and the drain electrode D. Accordingly, the leak of the high-frequency signal between the source electrode S and the drain electrode D is prevented. Thus, a third harmonic wave level can be lowered.

In the third embodiment, the description has been given of the case where the insulating film 510 having the large relative dielectric constant is formed of the third and fourth nitride films 513 and 514. However, as described above, the configuration of the insulating film 510 is not limited to that described above. Specifically, the insulating film 510 may be at least one insulating film. For example, the insulating film 510 may be formed of one nitride film or may be formed of three nitride films or more. Furthermore, the insulating film 510 may be formed of other insulating films such as an oxide film without being limited to the nitride film.

As described above, in this embodiment, a part of the gate wiring electrode GE is disposed between the source wiring electrode SE and the drain wiring electrode DE. In the first to third embodiments, as a part of the gate wiring electrode GE, the connection part 22 or the gate wiring 21 is disposed between the source wiring electrode SE and the drain wiring electrode DE.

Figure 10:
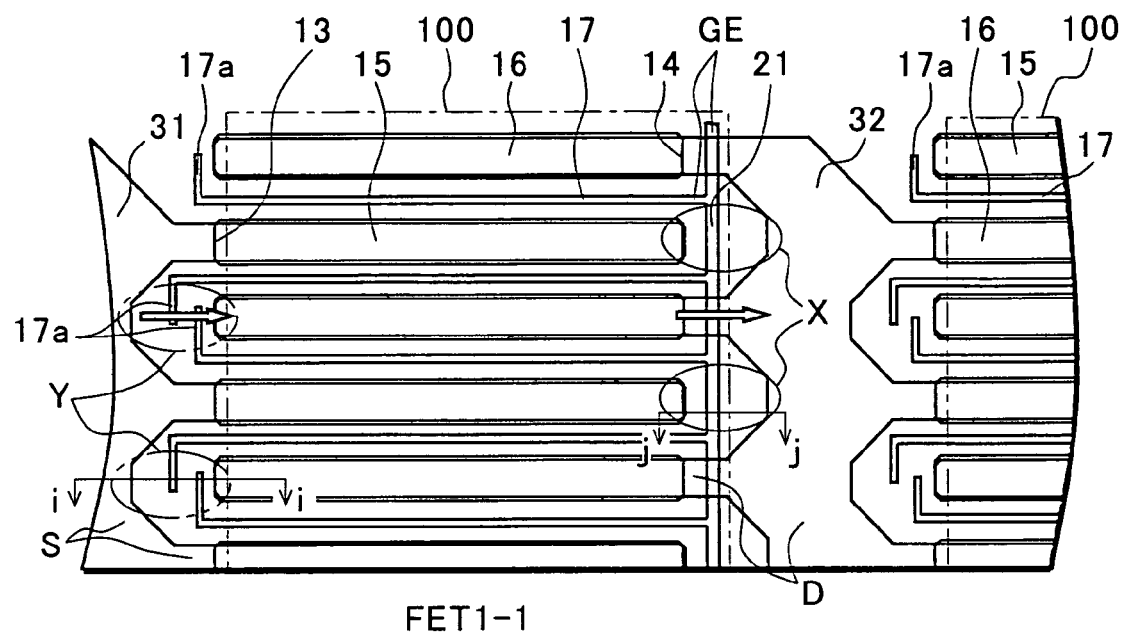
FIG. 10 is a plan view showing a fourth embodiment of the present invention.

With reference to FIGS. 10 and 11, a fourth embodiment will be described. In the fourth embodiment, as a part of a gate wiring electrode GE, a bent part is provided by bending one end of a gate electrode 17. The bent part is disposed between a source wiring electrode SE and a drain wiring electrode DE. Moreover, as to the same constituent components as those of the first to third embodiments, description thereof will be omitted.

FIG. 10 is an enlarged plan view of the operation region 100 of FET1-1, for example, in FIG. 2.

A first source electrode 13 and a first drain electrode 14 are disposed on the operation region 100 and come into contact with source and drain regions (not shown here), respectively.

Moreover, a second source electrode 15 and a second drain electrode 16 are disposed so as to overlap therewith. The second source electrode 15 and the second drain electrode 16 are connected to a source wiring 31 and a drain wiring 32, respectively.

Each of the gate electrodes 17 is formed into a strip shape having a predetermined gate length, and is extended in a first direction. Moreover, one end (tip) of the gate electrode 17 is extended to the outside of the operation region 100 and is bent in a second direction to form a bent part 17a. Furthermore, the other end of one gate electrode 17 and the other end of another gate electrode 17 are connected and bundled by a gate wiring 21. Specifically, the gate wiring electrode GE of the fourth embodiment includes the gate electrodes 17, the bent parts 17a and the gate wiring 21.

In FET1-1, the gate wiring 21 and one end (tip) of a source electrode S (the first and second source electrodes 13 and 15) are disposed on the operation region 100, and the bent parts 17a and one end (tip) of a drain electrode D (the first and second drain electrodes 14 and 16) are disposed outside the operation region 100. Moreover, the other ends of the first source electrodes 13 are disposed outside the operation region 100, and the other ends of the first drain electrodes 14 are disposed on the operation region 100. However, the gate wiring 21 may be disposed outside the operation region 100 as in the cases of the first to third embodiments. Moreover, the one end (tip) of the source electrode S (the first and second source electrodes 13 and 15), the one end (tip) of the drain electrode D (the first and second drain electrodes 14 and 16), the other ends of the first source electrodes 13, and the other ends of the first drain electrodes 14 may be disposed on or outside the operation region 100.

In FET1-1, the gate wiring 21 is disposed between the one end (tip) of the source electrode S and the drain electrode D (the drain wiring 32) which are close to each other. Moreover, the bent part 17a of the gate electrode 17 is disposed between the one end (tip) of the drain electrode D and the source electrode S (the source wiring 31) which are close to each other. The bent part 17a is disposed along a width of the one end of the drain electrode D in the vicinity of the one end. The extending direction of the bent part 17a is perpendicular to the extending direction of the gate electrode 17.

Moreover, the two adjacent bent parts 17a are alternately disposed so as to be extended in directions facing each other. Furthermore, between the source electrode S (the source wiring 31) and the drain electrode D, the bent parts 17a partially overlap with each other.

Note that, in FET1-2, arrangement of the second source electrodes 15 and the second drain electrodes 16 is opposite to that in FET1-1. Specifically, in the operation region 100 of FET1-2, the bent parts 17a are disposed in the vicinity of one ends of the second source electrodes 15 along with the one ends. As in the case of FET1-1, the bent parts 17a of the two adjacent gate electrodes 17 are disposed so as to face and overlap with each other. Moreover, the bent parts 17a are disposed between the one end of the source electrode S (the first and second source electrodes 13 and 15) and the drain electrode D (the drain wiring 32). The one end of the drain electrode D (the first and second drain electrodes 14 and 16) is disposed in the vicinity of the gate wiring 21.

FET1-3 is the same as FET1-1. Here, drains of FET1-1 and FET1-2 are connected to each other, and the drain wiring 32 is shared therebetween. Moreover, sources of FET1-2 and FET1-3 are connected to each other, and the source wiring 31 is shared therebetween.

As described above, in this embodiment, the bent part 17a is provided on one end of the gate electrode 17, and the other end of the gate electrode 17 and the other end of another gate electrode 17 are connected by the gate wiring 21. Moreover, the bent parts 17a are disposed so as to surround the one end of the source electrode S or the drain electrode D and to alternately overlap with each other from both sides.

Thus, it is possible to realize a pattern in which the gate wiring electrode GE is always disposed between the second source electrodes 15 and the drain wiring 32 and between the source wiring 31 and the second drain electrodes 16.

In the operation region 100, a high-frequency signal is transmitted through a path indicated by the arrows in FIG. 10. Specifically, in the Y regions which are the leak paths of the high-frequency signal in the conventional structure (FIG. 18), the gate wiring electrode GE (the bent parts 17a) is disposed between the source electrode S and the drain electrode D.

Thus, it is possible to prevent the high-frequency current from flowing through the substrate between the source electrode S and the drain electrode D in the Y regions. Moreover, the leak of the high-frequency signal can be prevented. Thus, a third harmonic wave level can be lowered.

Moreover, similarly, in the X region outside the operation region 100 of FET1-1, the gate wiring electrode GE (the gate wiring 21) is disposed between the source electrode S and the drain electrode D. Therefore, no leak of the high-frequency signal occurs in the X region.

Accordingly, the gate wiring electrode GE is disposed between the source electrode S and the drain electrode D in both of the X and Y regions outside the operation region 100 in FET1-1. Thus, it is possible to prevent the high-frequency signal from leaking through the substrate between the source electrode S and the drain electrode D. Consequently, the third harmonic wave level can be lowered.

Figure 11A:
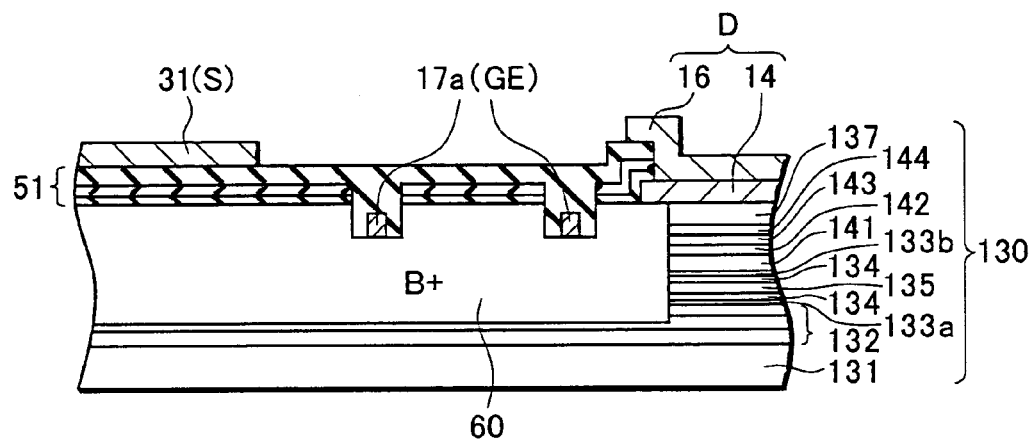
FIGS. 11A and 11B are cross-sectional views showing the fourth embodiment of the present invention.
Figure 11B:
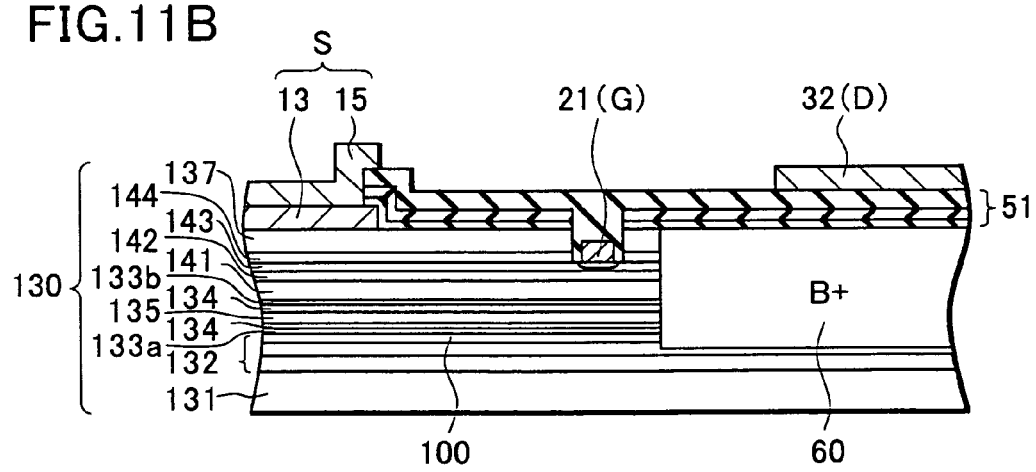

FIGS. 11A and 11B are cross-sectional views of FIG. 10. FIG. 11A is a cross-sectional view along the line i-i in FIG. 10, and FIG. 11B is a cross-sectional view along the line j-j in FIG. 10.

As shown in FIG. 11A, one ends of the first and second drain electrodes 14 and 16 and the source wiring 31 are disposed outside the operation region 100. A high-frequency signal passes through the first and second drain electrodes 14 and 16 and the source wiring 31 on an insulating region 60.

In FIG. 11A, in the case where no gate wiring electrode GE (bent parts 17a) is disposed, the high-frequency signal flowing through the source wiring 31 is transmitted to an insulating region 60 through a nitride film 51. As in the case of the nitride film 51, the insulating region 60, as a dielectric material, allows the high-frequency signal to pass therethrough. In this event, the second drain electrode 16 is connected to the first drain electrode 14 therebelow. Moreover, a tip of the first drain electrode 14 is Schottky-connected to the insulating region 60 outside the operation region. Therefore, a large high-frequency leak current flows between the source wiring 31 and the first drain electrode 14. Specifically, the leak of the high-frequency signal occurs between the source electrode S and the drain electrode D.

Moreover, in the state described above, since the source electrode S and the drain electrode D are disposed so as to directly face each other, a direct electric field exists between the source electrode S and the drain electrode D. Thus, a leak current of the high-frequency signal flows. In the case of this embodiment, the high-power Switch MMIC is adopted, which includes the switching elements having the plurality of FETs connected to each other in series. Thus, amplitude of the high-frequency signal is large, and amplitude of the high-frequency leak current is also large.

In this embodiment, as shown in FIG. 11A, the bent parts 17a of the gate electrodes 17 are disposed between the source wiring 31 and one end of the drain electrode D. Since the bent parts 17a are formed simultaneously with the gate electrodes 17 not shown here, the bent parts 17a are formed on the third undoped layer 143. The bent parts 17a come into direct contact with the insulating region 60 outside the operation region 100 and form Schottky junctions. Therefore, the high-frequency signal leaking into the insulating region 60 can be directly absorbed. Thus, the leak of the high-frequency signal between the source wiring 31 and the drain electrode D can be more significantly prevented.

Moreover, as shown in FIG. 11B, the gate wiring 21 is similarly disposed between the drain wiring 32 and one end of the source electrode S (the first and second source electrodes 13 and 15). Thus, the leak of the high-frequency signal can be prevented. Therefore, the leak of the high-frequency signal between the source electrode S and the drain electrode D can be blocked by the gate wiring electrode GE. The mechanism is as described above.

Note that, although not shown in the drawings, the same goes for the case where the gate wiring 21 is disposed outside the operation region 100.

In order to prevent the leak of the high-frequency signal, it is preferable that the bent parts 17a are disposed continuously without interruption for the leak path between the source electrode S and the drain electrode D.

Accordingly, in the fourth embodiment, for one of the second source electrodes 15 (similarly, the second drain electrodes 16), the two bent parts 17a are alternately disposed so as to be extended in the directions facing each other. Thus, in the case where a pattern of the gate electrodes 17 and the bent parts 17a is formed by lift-off, a resist remover seeps through alternate gaps in the pattern. Thus, the lift-off can be easily performed. Moreover, the two bent parts 17a are disposed so as to partially overlap with each other with respect to the leak path between the source electrode S and the drain electrode D. Accordingly, the linear leak path between the source electrode S and the drain electrode D is completely blocked. Thus, the leak of the high-frequency signal can be completely prevented.

Note that, in the fourth embodiment, the description has been given of the case where the one gate electrode 17 (the bent part 17a) and another gate electrode 17 (the bent part 17a) are formed in the same pattern. However, without being limited thereto, a pattern in which the bent parts 17a facing each other have different lengths may be adopted. Alternatively, a pattern in which the bent part 17a of one of the gate electrodes 17 adjacent to each other is further extended and no bent part is provided in the other gate electrode 17 may be adopted. In either case, if the bent parts 17a are not connected to each other and are disposed so as to block the leak path of the high-frequency signal, the leak of the high-frequency signal is prevented. Moreover, the lift-off of the gate wiring electrode GE is also facilitated.

Figure 12:
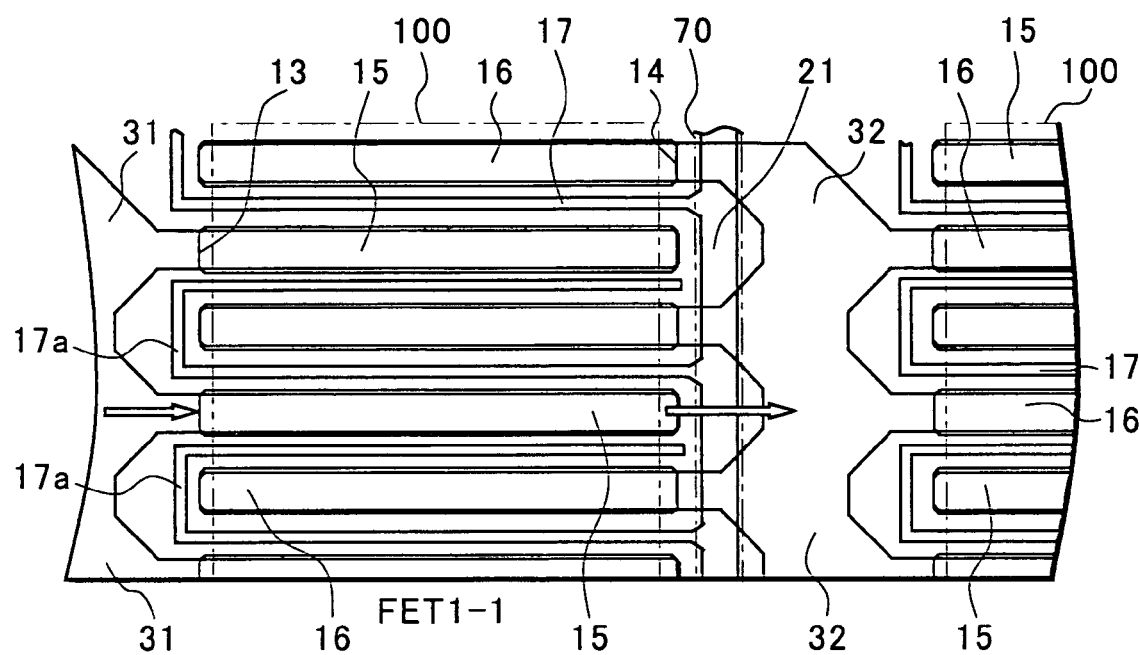
FIG. 12 is a plan view showing a fifth embodiment of the present invention.

FIG. 12 is a plan view showing a fifth embodiment. The fifth embodiment is the same as the fourth embodiment except for the pattern of a gate electrodes 17 and the bent parts 17a. Thus, repetitive description will be omitted.

FIG. 12 is an enlarged plan view of the operation region 100 in FET1-1, for example, in FIG. 2, as in the case of FIG. 10. In the fifth embodiment, a bent part 17a is provided by extending one end (tip) of the gate electrode 17. Moreover, the one end of the gate electrode 17 is extended to the vicinity of a gate wiring 21.

Specifically, in FIG. 12, the gate electrode 17 starts from the gate wiring 21, surrounds a tip of a second drain electrode 16, and is extended toward the gate wiring 21 again. The tip of the second drain electrode 16 is completely surrounded by the bent part 17a and the gate electrode 17. Unlike the fourth embodiment, the gate electrode 17 having the other end connected to the gate wiring 21 is provided so as to correspond to each of the second drain electrodes 16, for example. However, by further extending the tip from the bent part 17a to the vicinity of the gate wiring 21, the extended portion becomes the gate electrode 17 on the operation region 100. Specifically, in the operation region 100, the gate electrodes 17 are disposed between first source electrodes 13 and first drain electrodes 14, respectively. Thus, the same configuration as that of the fourth embodiment is realized.

The bent part 17a, a part of the gate electrode 17, a tip of the gate electrode 17, a tip of second source electrode 15 (the first source electrode 13), and a tip of the second drain electrode 16 (the first drain electrode 14) are disposed outside the operation region 100. Moreover, the gate wiring 21 is also disposed outside the operation region 100, and a peripheral conduction region 70 for improving isolation is disposed below the gate wiring 21. In this case, the bent part 17a and the tip of the second drain electrode 16 (the first drain electrode 14) may be disposed within the operation region 100.

Thus, the bent parts 17a and the gate wiring 21 can be disposed between one end of a drain electrode D and a source wiring 31 and between one end of a source electrode S and a drain wiring 32. Therefore, a gate wiring electrode GE is disposed in all transmission paths of the high-frequency signal between the source electrode S and the drain electrode D. Thus, the leak of the high-frequency signal between the source electrode S and the drain electrode D can be prevented.

Particularly, the one end (tip) of the drain electrode D is approximately completely surrounded by the gate wiring electrode GE. Thus, the pattern described above is effective in preventing the leak of the high-frequency signal.

Furthermore, one ends (tips) of the gate electrodes 17 are separated from the gate wiring 21. Therefore, in the case where the pattern of the gate electrodes 17 is formed by lift-off, a resist remover seeps through gaps between the tips of the gate electrodes 17 and the gate wiring 21. Thus, the lift-off can be easily performed.

Figure 13:
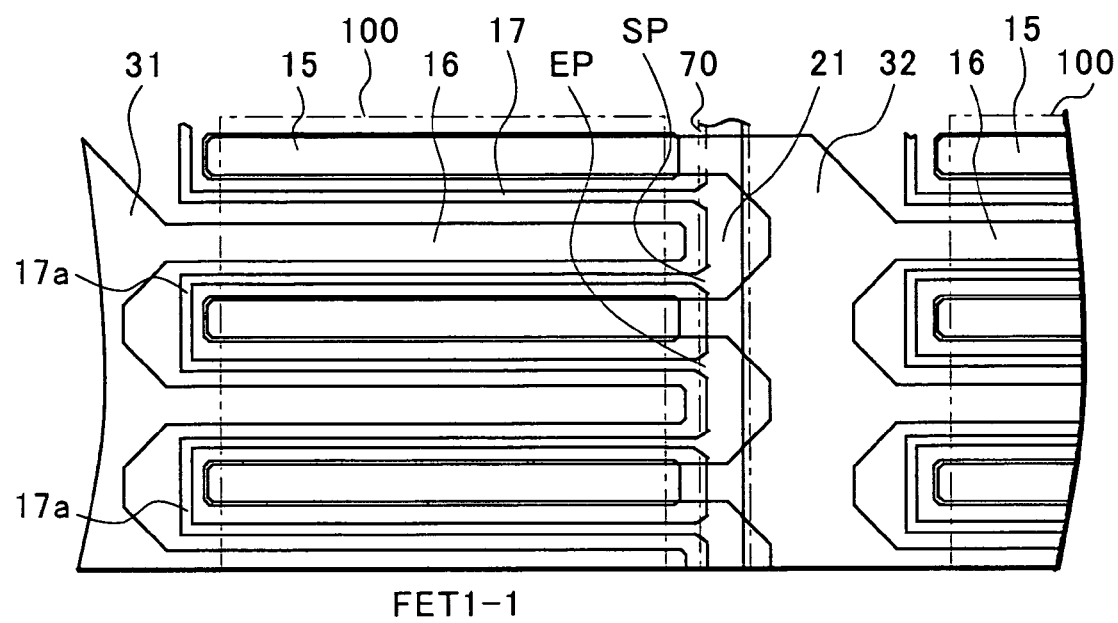
FIG. 13 is a plan view showing a sixth embodiment of the present invention.

FIG. 13 shows a sixth embodiment of the present invention, and is an enlarged plan view of an operation region 100 in FET1-1, for example, in FIG. 2.

The sixth embodiment is the same as the fourth and fifth embodiments except for the pattern of gate electrodes 17. Thus, repetitive description will be omitted.

In the sixth embodiment, a pattern in which bent parts 17a facing each other are connected to each other is formed. In other words, a gate wiring electrode GE has a closed-loop shape. To be more specific, each of gate electrodes 17 starts from a gate wiring 21 as a starting point SP, surrounds a tip of a second drain electrode 16 here, is extended again toward the gate wiring 21, and is connected to the gate wiring 21 at an end point EP. The starting point SP and the end point EP are disposed on both sides of each of the second drain electrodes 16. Thus, the tip of a second source electrode 15 or the second drain electrode 16 is completely surrounded by the bent part 17a and the gate electrode 17.

A difference in the pattern between the first and sixth embodiments is as follows. Specifically, in the first embodiment, one ends of the gate electrodes are all connected by a connection part 22. On the other hand, in this embodiment, the two gate electrodes 17 are connected by the bent part 17a.

The bent part 17a, a part of the gate electrode 17, one end of a source electrode S and one end of a drain electrode D are disposed outside an operation region 100. Moreover, the gate wiring 21 is also disposed outside the operation region 100, and a peripheral conduction region 70 for improving isolation is disposed below the gate wiring 21. Note that the gate wiring electrode GE, the one end of the source electrode S and the one end of the drain electrode D may be all disposed within the operation region 100.

Thus, the gate wiring electrode GE can be disposed between the source electrode S and the drain electrode D. Therefore, the leak of the high-frequency signal between the source electrode S and the drain electrode D can be prevented.

Particularly, the one end of the drain electrode D (one ends of the first and second drain electrodes 14 and 16) is completely surrounded by the gate electrodes 17 and the bent parts 17a. Thus, the pattern described above is effective in preventing the leak of the high-frequency signal.

In the case where such a loop-shaped pattern of the gate electrodes 17 is formed by lift-off, there is a problem that it is usually difficult to perform the lift-off since the resist remover cannot seep into the loop from outside of the loop. However, in the sixth embodiment, the lift-off can be performed for the same reason as that of the first embodiment.

Figure 14:
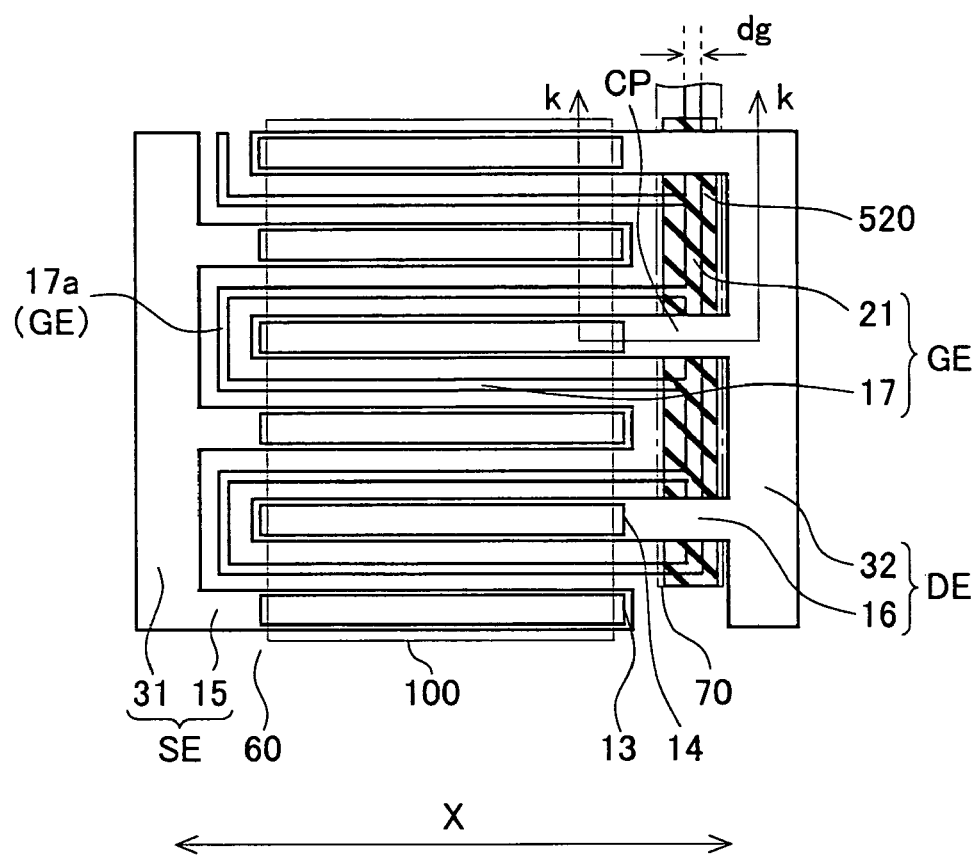
FIG. 14 is a plan view showing a seventh embodiment of the present invention.

With reference to FIGS. 14 and 15, a seventh embodiment of the present invention will be described. In the seventh embodiment, a capacitance at a cross part CP is reduced as in the case of the second embodiment, in the fourth to sixth embodiments. Note that, as to the constituent components described above, detailed description thereof will be omitted.

FIG. 14 is an enlarged plan view of an operation region 100 of FET1-1, for example, in FIG. 2. A pattern of the gate wiring electrode GE is the same as that of the sixth embodiment.

Here, a second drain electrode 16 and a gate wiring 21 intersect with each other at the cross part CP. On the gate wiring 21, a first insulating film (not shown here) is disposed. Moreover, on the first insulating film, a second insulating film 520 is disposed along the gate wiring 21.

Since a cross-sectional view along the line k-k in FIG. 14 is the same as FIG. 8B in the second embodiment, description thereof will be omitted. Second source electrodes 15 and the second drain electrodes 16 are formed of a second wiring metal layer 40. On the gate wiring 21, a first insulating film 510 having a large relative dielectric constant and the second insulating film 520 having a small relative dielectric constant are disposed. The second drain electrodes 16 intersect with the gate wiring 21 on the insulating films 510 and 520. The first insulating film 510 is at least one nitride film, for example.

Thus, the capacitance at the cross part CP can be reduced. Moreover, compared with the sixth embodiment having the same pattern of a gate wiring electrode GE, a second harmonic wave level can be lowered.

Specifically, in the sixth embodiment, as in the case of the conventional structure (FIG. 18), the second harmonic wave level is −62 dBc (the solid line w in FIG. 6) in the case of the gate wiring width dg=1 μm at the input power of 29 dBm. Meanwhile, in the seventh embodiment, the second harmonic wave level is improved to −75 dBc (a solid line z in FIG. 6). However, unlike the second embodiment, the gate wiring electrode GE does not have a ladder-like pattern in the seventh embodiment. Thus, phases in the entire gate wiring electrode GE will never be matched with each other. Specifically, the second harmonic wave level will never reach those of the second and third embodiments.

Moreover, the gate wiring electrode GE is disposed between a source electrode S and a drain electrode D which are disposed close to each other. Accordingly, the leak of the high-frequency signal between the source electrode S and the drain electrode D is prevented. Thus, a third harmonic wave level can be lowered.

Figure 15A:
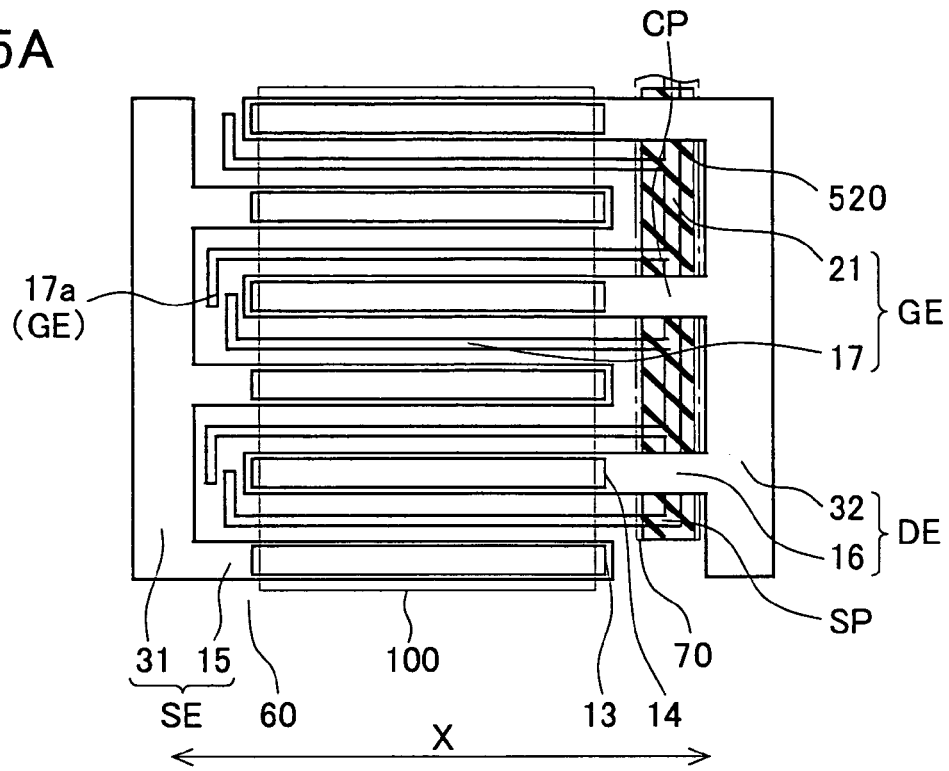
FIGS. 15A and 15B are plan views showing the seventh embodiment of the present invention.
Figure 15B:
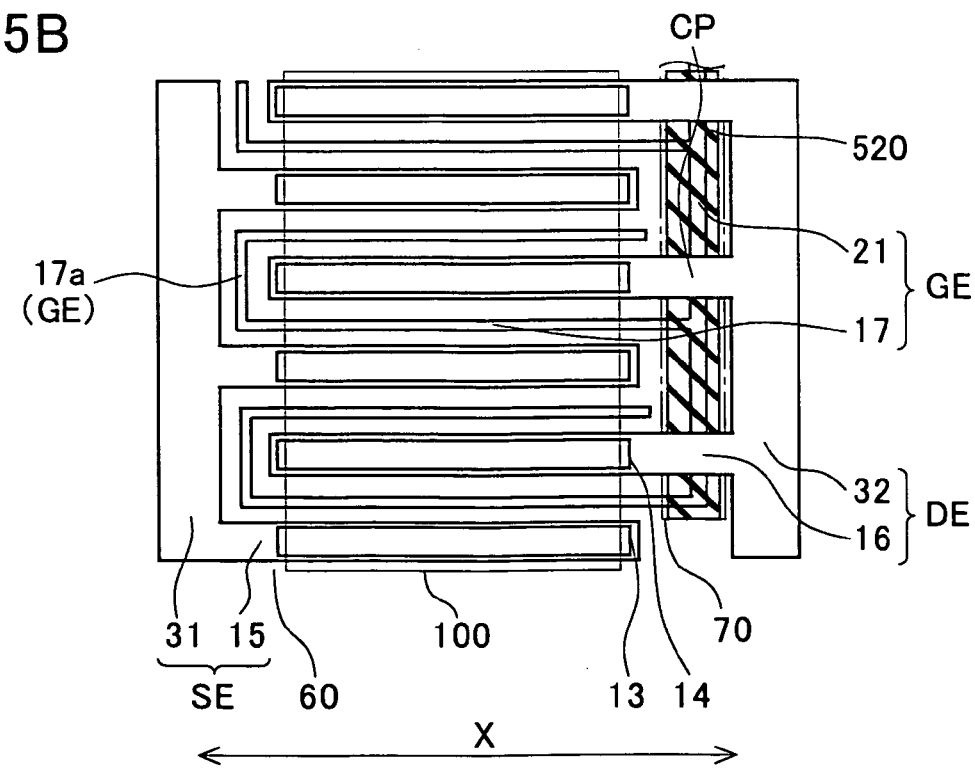

FIGS. 15A and 15B show other patterns of the gate wiring electrode GE according to the seventh embodiment. Specifically, FIG. 15A shows the case where the first and second insulating films 510 and 520 are disposed in the pattern of the gate wiring electrode GE according to the fourth embodiment (FIG. 10).

Moreover, FIG. 15B shows the case where the first and second insulating films 510 and 520 are disposed in the pattern of the gate wiring electrode GE according to the fifth embodiment (FIG. 12).

In either case, the parasitic capacitance can be reduced by providing the second insulating film 520 having the small relative dielectric constant on the first insulating film 510 at the cross part CP. Accordingly, it is possible to prevent the leak of the high-frequency signal between the source electrode S and the gate wiring electrode GE or between the drain electrode D and the gate wiring electrode GE. Thus, the second harmonic wave level can be lowered. Furthermore, on all the paths in which the high-frequency signal may leak between the source electrode S and the drain electrode D, the gate wiring electrode GE is disposed. Accordingly, it is possible to prevent the leak of the high-frequency signal between the source electrode S and the drain electrode D. Thus, the third harmonic wave level can be lowered.

As described above, the both of second and third harmonic wave levels can be reduced. Thus, distortion characteristics as designed can be obtained. In the Switch MMIC, predetermined distortion characteristics cannot be obtained unless the both of second and third harmonic wave levels are reduced. In other words, the predetermined distortion characteristics cannot be obtained by reducing either one of the second and third harmonic wave levels. In this embodiment, the second insulating film 520 having the small relative dielectric constant is provided at the cross part CP and the bent parts 17a are further provided. Thus, the predetermined distortion characteristics can be obtained. Specifically, in the Switch MMIC, it is very effective for improvement in the distortion characteristics to combine the two measures described above.

Also in the seventh embodiment, the description has been given of the case where the first insulating film 510 having the large relative dielectric constant is formed of third and fourth nitride films 513 and 514. However, as described above, the configuration of the first insulating film 510 is not limited to that described above. Specifically, the first insulating film 510 may be at least one insulating film having a relative dielectric constant larger than that of the second insulating film 520. For example, the first insulating film 510 may be formed of one nitride film or may be formed of three nitride films or more. Furthermore, the first insulating film 510 may be formed of other insulating films such as an oxide film without being limited to the nitride film.

Figure 16:
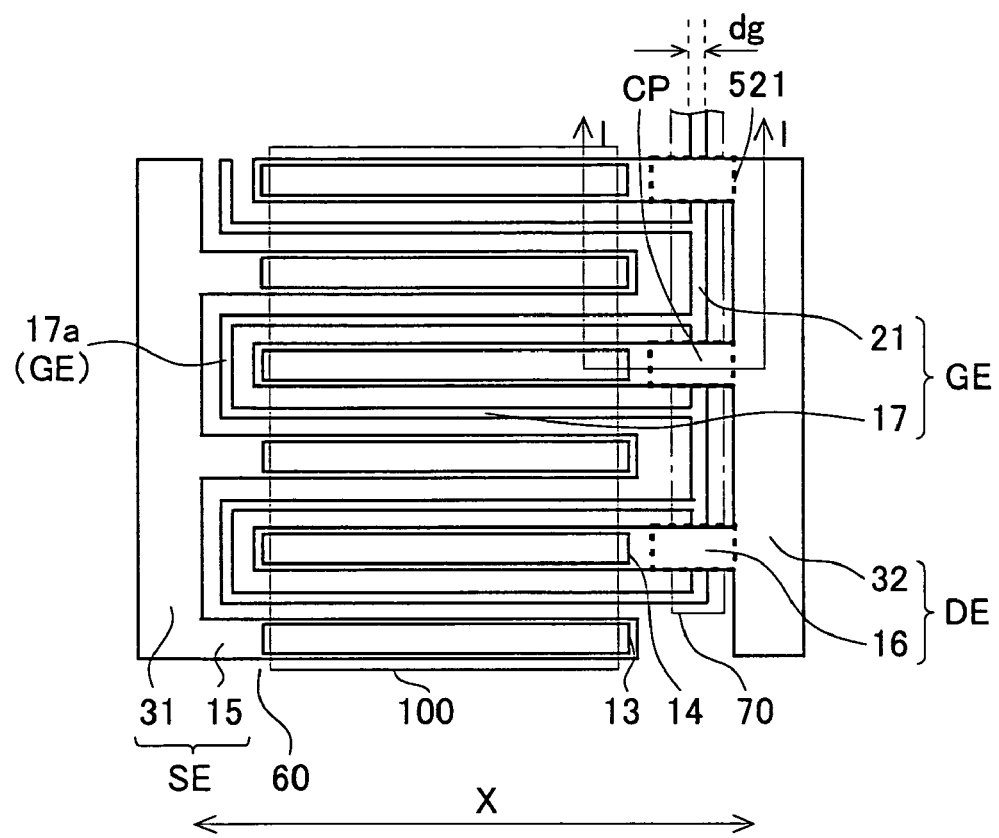
FIG. 16 is a plan view showing an eighth embodiment of the present invention.

With reference to FIGS. 16 and 17, an eighth embodiment will be described. The eighth embodiment is the case where a capacitance is reduced by providing a hollow part at a cross part CP.

Figure 17A:
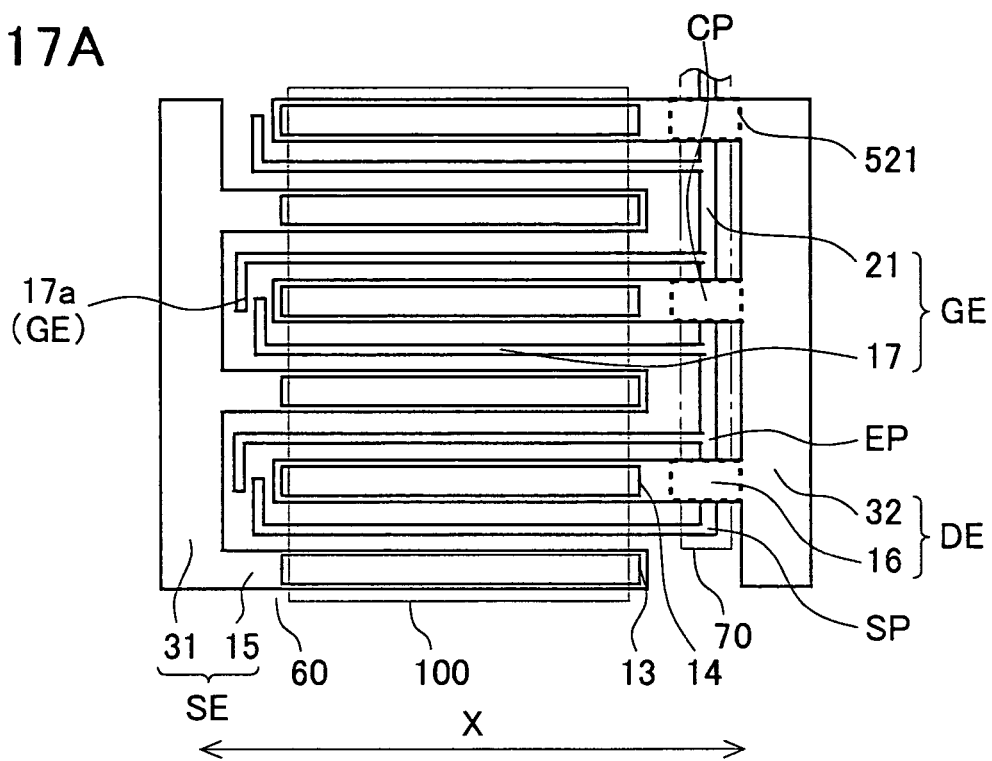
FIGS. 17A and 17B are plan views showing the eighth embodiment of the present invention.
Figure 17B:
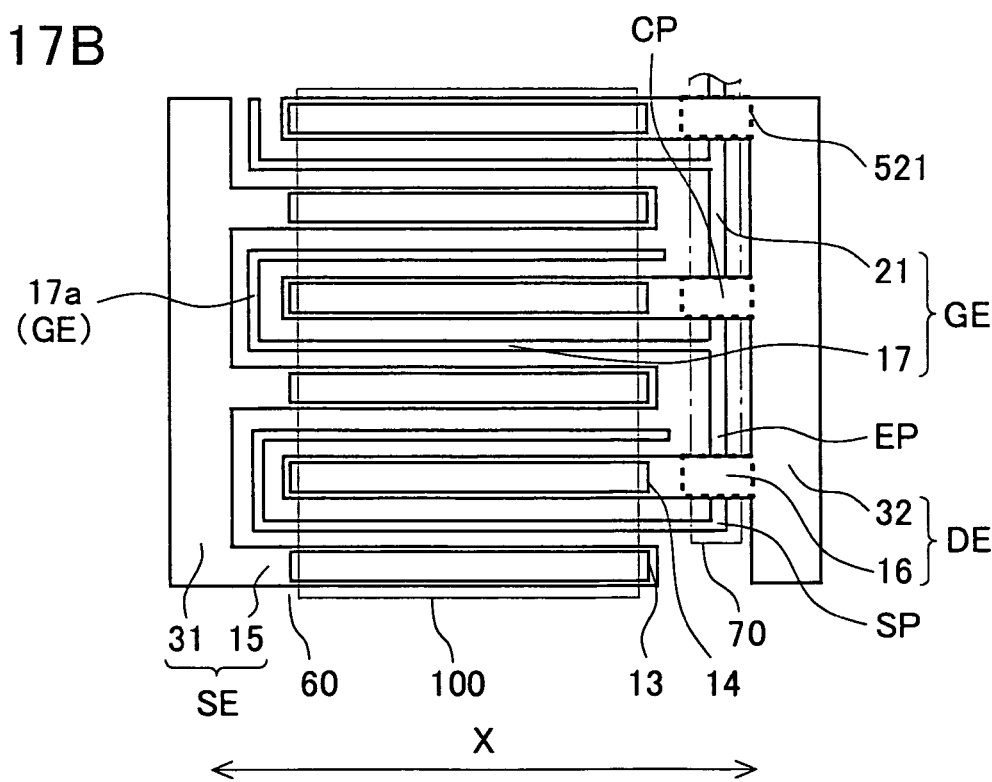

FIG. 16 is an enlarged plan view of an operation region 100 in FET1-1, for example, in FIG. 2. The pattern of a gate wiring electrode GE is the same as that of the sixth embodiment. Moreover, FIGS. 17A and 17B show other patterns of the gate wiring electrode GE according to the eighth embodiment. FIG. 17A shows the pattern of the gate wiring electrode GE in the fourth embodiment (FIG. 10), and FIG. 17B shows the pattern of the gate wiring electrode GE in the fifth embodiment (FIG. 12).

Here, a second drain electrode 16 and a gate wiring 21 intersect with each other at the cross part CP. At the cross part CP, an insulating film (not shown here) is disposed on the gate wiring 21, and a hollow part 521 is disposed thereon as indicated by a thick broken line.

Since a cross-sectional view along the line l-l in FIG. 16 is the same as FIG. 9B in the third embodiment, description thereof will be omitted. Second source electrodes 15 and the second drain electrodes 16 are formed of a second wiring metal layer 40. On the gate wiring 21, an insulating film 510 having a large relative dielectric constant and the hollow part 521 having a small relative dielectric constant are disposed, on which the second drain electrode 16 intersects with the gate wiring 21. The insulating film 510 is at least one nitride film, for example.

Thus, the capacitance at the cross part CP can be reduced. Moreover, compared with the sixth embodiment having the same pattern of the gate wiring electrode GE, a second harmonic wave level can be lowered.

Specifically, in the sixth embodiment, as in the case of the conventional structure (FIG. 18), the second harmonic wave level is −62 dBc (the solid line w in FIG. 6) in the case of the gate wiring width dg=1 µm at the input power of 29 dBm. Meanwhile, in the eighth embodiment, the second harmonic wave level is improved to −75 dBc (the solid line z in FIG. 6). Specifically, unlike the second embodiment, the gate wiring electrode GE does not have a ladder shape in the eighth embodiment. Thus, phases in the entire gate wiring electrode GE will never be matched with each other. In other words, the second harmonic wave level will never reach those of the second and third embodiments.

Moreover, the gate wiring electrode GE is disposed between a source electrode S and a drain electrode D which are disposed close to each other. Accordingly, the leak of the high-frequency signal between the source electrode S and the drain electrode D is prevented. Thus, a third harmonic wave level can be lowered.

Note that, although not shown in the drawings, FET may be a GaAs MESFET. In this case, an impurity region is formed by ion implantation on a semi-insulating GaAs substrate.

For example, an operation region 100 is an n type impurity region formed by ion implantation. In addition, a source region 137s and a drain region 137d are n+ type impurity regions formed by ion implantation. Moreover, a peripheral conduction region 70 for improving isolation is an n+ type impurity region formed by ion implantation simultaneously with the source region 137s and the drain region 137d. Furthermore, a control resistor (high resistance element) is an n type impurity region formed by ion implantation simultaneously with the operation region 100. In the above case, the semi-insulating GaAs substrate is not completely electrically insulator. And resistivity of the semi-insulating GaAs substrate is equal to or more than $1\times10^7$ Ω·cm and equal to or less than $1\times10^9$ Ω·cm. On the other hand the resistivity of insulator like glass, ceramics or gum is more than $1\times10^{10}$ Ω·cm. Namely the semi-insulating GaAs substrate is clearly distinguished from insulator like glass, ceramics or gum at resistivity value too. Actually the semi-insulating GaAs substrate is "semiconductor", and insulator like glass, ceramics or gum is not "semiconductor". That is, semiconductor and insulator are substantially different.

Moreover, the impurity regions described above may be formed in such a manner that an epitaxial layer having a predetermined impurity concentration is grown on the semi-insulating GaAs substrate and the regions are isolated by an insulating region which is formed by ion (boron ion, hydrogen ion or oxygen ion) implantation.

Furthermore, the description has been given of the case where the first and second source electrodes 13 and 15 overlap with each other and the first and second drain electrodes 14 and 16 overlap with each other in the source electrode S and the drain electrode D on the operation region 100. However, the second source electrodes 15 and the second drain electrodes 16 may not be disposed on the operation region 100. Specifically, one ends of the second source electrodes 15 may not exist in the vicinity of a connection part 22 and the bent parts 17a, but only one ends of the first source electrodes 13 may exist. Moreover, one ends of the second drain electrodes 16 may not exist in the vicinity of the connection part 22 and the bent parts 17a, but only one ends of the first drain electrodes 14 may exist.

The DPDT Switch MMIC including the logic circuit has been described above as an example. However, the configuration of the switch circuit device is not limited to the example described above. The device may have a configuration including different number of input ports and output ports such as SP3T, SP4T, DP4T and DP7T. Moreover, the device may or may not include the logic circuit. Furthermore, a shunt FET for preventing a leak of a high-frequency signal may be connected to the off-side output terminal.

According to the embodiment of the present invention, the following effects can be obtained.

First, a part of a gate wiring electrode is disposed between a source wiring electrode and a drain wiring electrode which are disposed adjacent to each other.

Thus, a high-frequency current flowing through a substrate between the source wiring electrode and the drain wiring electrode (between a source electrode and a drain wiring and between a drain electrode and a source wiring) can be blocked by the gate wiring electrode (gate electrodes, a gate wiring, and a connection part or bent parts). Specifically, in a Switch MMIC, all conventional leak paths of a high-frequency signal between the source and drain electrodes of first and second metal layers can be blocked by the gate wiring electrode.

In an off-side FET, the gate wiring electrode is a GND potential as the high-frequency signal. Therefore, in the all conventional leak paths of the high-frequency signal in the off-side FET, the GND potential is disposed between potentials of the source and drain electrodes. Specifically, a direct electric field of the high-frequency signal between the source and drain electrodes is significantly weakened by disposing the gate wiring electrode of the GND potential as the high-frequency signal between the source and drain electrodes. Accordingly, a leak of the high-frequency signal between the source and drain electrodes can be prevented. Thus, a third harmonic wave level can be sufficiently lowered.

Secondly, by forming a pattern of the gate electrodes into a ladder shape, phases of the gate electrodes are matched as the entire FET. Therefore, in the off-side FET, phases of high-frequency signals leaking through a depletion layer below the gate electrodes are also matched as the entire FET. Thus, a second harmonic wave level can be significantly improved.

Thirdly, by forming the pattern of the gate electrodes into the ladder shape or a comb shape, an electrostatic breakdown voltage can be improved compared with meander-shaped gate electrodes.

Fourthly, at cross parts between the gate wiring electrode and the source wiring electrode and between the gate wiring electrode and the drain wiring electrode, a nitride film and a polyimide are disposed on the gate wiring electrode, and the source wiring electrode or the drain wiring electrode is extended thereon. Accordingly, even if the pattern of the gate electrodes has the ladder shape or the comb shape, parasitic capacitances at the cross parts are sufficiently reduced. Thus, the leak of the high-frequency signal no longer occurs. Therefore, the second harmonic wave level can be further lowered.

Fifthly, the polyimide is also provided in the conventional structure, in order to prevent short-circuiting at spots where other metal layers intersect with each other. Specifically, the parasitic capacitance can be reduced only by changing a polyimide formation pattern without adding a special step. Furthermore, the parasitic capacitance can be reduced without changing a pattern of a gate wiring and wiring metal layers in a conventional Switch MMIC. Therefore, the parasitic capacitance can be reduced while maintaining a chip area.

Sixthly, at the cross part, a nitride film and a hollow part are disposed on the gate wiring electrode, and the source wiring electrode or the drain wiring electrode is extended thereon. Accordingly, even if the pattern of the gate electrodes has the ladder shape or the comb shape, the parasitic capacitance at the cross part is sufficiently reduced. Thus, the leak of the high-frequency signal no longer occurs. Therefore, the second harmonic wave level can be further lowered.

Seventhly, the hollow part is also provided in the conventional structure, in order to prevent short-circuiting at spots where other metal layers intersect with each other. Specifically, the parasitic capacitance can be reduced only by changing a hollow part formation pattern without adding a special step. Moreover, the parasitic capacitance can be reduced without changing the pattern of the gate wiring and the wiring metal layers in the conventional Switch MMIC. Therefore, the parasitic capacitance can be reduced while maintaining the chip area.

Eighthly, according to this embodiment, both of second and third harmonic wave levels can be reduced. Thus, distortion characteristics as designed can be obtained. In the Switch MMIC, predetermined distortion characteristics cannot be obtained unless the both of second and third harmonic wave levels are reduced. In other words, the predetermined distortion characteristics cannot be obtained by reducing either one of the second and third harmonic wave levels. In the Switch MMIC, it is very effective for improvement in the distortion characteristics to combine the two measures described above, as in the case of this embodiment.

What is claimed is:

1. A field effect transistor comprising:
    a compound semiconductor substrate;
    a plurality of source electrodes elongated in a first direction;
    a plurality of drain electrodes elongated in the first direction, the source electrodes and the drain electrodes being positioned alternatively with respect to a second direction;
    a source wiring electrode formed on the substrate and connecting the source electrodes;
    a drain wiring electrode formed on the substrate and connecting the drain electrodes; and
    a gate wiring electrode formed on the substrate and comprising a first gate wiring portion disposed parallel to the second direction and a plurality of second gate wiring portions extending from the first gate wiring portion in the first direction,
    wherein each of the second gate wiring portions is disposed between a corresponding source electrode and a corresponding drain electrode, and said each of the second gate wiring portions bends in the second direction to cover an end portion of the corresponding source electrode or the corresponding drain electrode.

2. The transistor of claim 1, wherein the portions bending in the second direction of the second gate wiring portions are connected.

3. The transistor of claim 1, wherein the first direction is normal to the second direction.

4. The transistor of claim 1, further comprising a crossing portion in which the gate wiring electrode is placed between the substrate and the source wiring electrode or between the substrate and the drain wiring electrode.

5. The transistor of claim 4, wherein the crossing portion comprises a first insulating film disposed on the gate wiring electrode and a second insulating film disposed on the first insulating film and having a dielectric constant smaller than the first insulating film.

6. The transistor of claim 5, wherein the first insulating film is thinner than the second insulating film.

7. The transistor of claim 5, wherein the first insulating film comprises a nitride film.

8. The transistor of claim 5, wherein the second insulating film comprises a polyimide.

9. The transistor of claim 4, wherein the crossing portion comprises an insulating film disposed on the gate wiring electrode and a hollow portion disposed above the insulating film and below the source wiring electrode or the drain wiring electrode.

10. The transistor of claim 9, wherein a thickness of the insulating film is smaller than a thickness of the hollow portion.

11. The transistor of claim 9, wherein the insulating film comprises a nitride film.

12. The transistor of claim 1, wherein the compound semiconductor substrate comprises;
    an undoped compound semiconductor substrate,
    a semiconductor layer formed on the undoped compound semiconductor substrate, the semiconductor layer comprising buffer layers, a first electron supply layer, a channel layer, a second electron supply layer, a first undoped layer lattice-matched to the second electron supply layer, a second undoped layer lattice-matched to the first undoped layer, a third undoped layer lattice-matched to the second undoped layer, a stable layer lattice-matched to the third undoped layer, and a cap layer lattice-matched to the stable layer.

13. The transistor of claim 1, wherein one of the source electrodes is surrounded by the gate wiring electrode without a break in plan view of the field effect transistor.

14. The transistor of claim 1, wherein one of the drain electrodes is surrounded by the gate wiring electrode without a break in plan view of the field effect transistor.

* * * * *